(12) United States Patent
Kim et al.

(10) Patent No.: US 12,211,846 B2
(45) Date of Patent: Jan. 28, 2025

(54) SEMICONDUCTOR DEVICE

(71) Applicant: Samsung Electronics Co., Ltd., Suwon-si (KR)

(72) Inventors: Sung Soo Kim, Seoul (KR); Gi Gwan Park, Suwon-si (KR); Jung Hun Choi, Seoul (KR); Koung Min Ryu, Hwaseong-si (KR); Sun Jung Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/415,863

(22) Filed: Jan. 18, 2024

(65) Prior Publication Data
US 2024/0153948 A1     May 9, 2024

Related U.S. Application Data

(63) Continuation of application No. 16/937,912, filed on Jul. 24, 2020, now Pat. No. 11,908,858, which is a
(Continued)

(30) Foreign Application Priority Data

Nov. 16, 2015    (KR) ........................ 10-2015-0160290

(51) Int. Cl.
    *H01L 27/088*      (2006.01)
    *H01L 21/8234*      (2006.01)
    (Continued)

(52) U.S. Cl.
    CPC .. *H01L 27/0886* (2013.01); *H01L 21/823431* (2013.01); *H01L 21/823456* (2013.01);
(Continued)

(58) Field of Classification Search
    CPC ............ H01L 27/0886; H01L 27/0924; H01L 21/823431; H01L 21/823475;
(Continued)

(56) References Cited

U.S. PATENT DOCUMENTS 6,444,515 B2    9/2002   Matsuo et al.
6,777,343 B2    8/2004   Park et al.
(Continued)

FOREIGN PATENT DOCUMENTS

KR     20060000912 A    1/2006
TW      201322426 A    6/2013

OTHER PUBLICATIONS

Chinese Office Action for corresponding Chinese Application No. 201610944717.0, dated Apr. 1, 2021.

*Primary Examiner* — Christine A Enad
(74) *Attorney, Agent, or Firm* — Harness, Dickey & Pierce, P.L.C.

(57) ABSTRACT

A semiconductor device includes a substrate including a first region, and a second region, a first gate structure and a second gate structure on the substrate of the first region, a third gate structure and a fourth gate structure on the substrate of the second region, a first interlayer insulating film on the substrate of the first region and including a first lower interlayer insulating film and a first upper interlayer insulating film, a second interlayer insulating film on the substrate of the second region and including a second lower interlayer insulating film and a second upper interlayer insulating film, a first contact between the first gate structure and the second gate structure and within the first interlayer insulating film, and a second contact formed between the third gate structure and the fourth gate structure and within the second interlayer insulating film.

17 Claims, 21 Drawing Sheets

Related U.S. Application Data continuation of application No. 15/333,545, filed on Oct. 25, 2016, now Pat. No. 10,763,254.

(51) Int. Cl.
| | |
|---|---|
| *H01L 23/485* | (2006.01) |
| *H01L 23/528* | (2006.01) |
| *H01L 27/092* | (2006.01) |
| *H01L 29/423* | (2006.01) |
| *H01L 29/739* | (2006.01) |

(52) U.S. Cl.
CPC .... *H01L 21/823475* (2013.01); *H01L 23/485* (2013.01); *H01L 23/5283* (2013.01); *H01L 29/42364* (2013.01); *H01L 29/42372* (2013.01); *H01L 27/0924* (2013.01); *H01L 29/7391* (2013.01)

(58) Field of Classification Search
CPC ........... H01L 21/823456; H01L 23/485; H01L 23/5283; H01L 29/42364; H01L 29/42372; H01L 29/7391
See application file for complete search history.

(56) References Cited

U.S. PATENT DOCUMENTS

| | | | |
|---|---|---|---|
| 8,426,300 | B2 | 4/2013 | Ramachandran et al. |
| 2001/0045666 | A1 | 11/2001 | Kim et al. |
| 2012/0119300 | A1 | 5/2012 | Kim et al. |
| 2013/0149854 | A1* | 6/2013 | Ishii ................ H01L 21/823425 438/587 |
| 2014/0103403 | A1 | 4/2014 | Kim et al. |
| 2014/0361352 | A1 | 12/2014 | Hung et al. |
| 2015/0021683 | A1 | 1/2015 | Xie et al. |
| 2015/0061027 | A1* | 3/2015 | Hong ................ H01L 21/28185 438/585 |
| 2015/0179457 | A1 | 6/2015 | Hung et al. |
| 2015/0194422 | A1 | 7/2015 | Liu et al. |
| 2016/0351709 | A1* | 12/2016 | Nishikawa .......... H01L 27/0922 |

* cited by examiner

SEMICONDUCTOR DEVICE

CROSS-REFERENCE TO RELATED APPLICATION

This application is a continuation application of U.S. application Ser. No. 16/937,912, filed Jul. 24, 2020, which is a continuation of Ser. No. 15/333,545, filed Oct. 25, 2016, which claims priority to Korean Patent Application No. 10-2015-0160290 filed on Nov. 16, 2015, the disclosures of each of which are hereby incorporated by reference in their entirety.

BACKGROUND

1. Technical Field

Example embodiments relate to a semiconductor device.

2. Description of the Related Art

The recent increase in the distribution of information media has led to advancement in the functionalities of semiconductor devices. To ensure higher competitiveness, new semiconductor products may have to meet demands for lower cost and higher quality by way of higher integration. Semiconductor scale-down continues to achieve higher integration.

Research is under way to increase operating speed of a semiconductor device and enhance integration density. The semiconductor device is equipped with discrete devices such as metal-oxide-semiconductor (MOS) transistors. The integration of the semiconductor device resulted in gradually decreasing distances between gates of the MOS transistors, and also gradually narrowed contact forming regions between the gates.

SUMMARY

An object of the example embodiments is to provide a semiconductor device capable of improving operation performance and reliability, by adjusting a size of a source/drain contact according to inter-gate spacing.

The objectives that are intended to be addressed by the example embodiments are not limited to those mentioned above, and other objectives that are not mentioned above can be clearly understood to those skilled in the art based on the description provided below.

According to example embodiment, a semiconductor device includes a substrate including a first region, and a second region; a first gate structure and a second gate structure formed on the substrate of the first region, the first gate structure and the second gate structure being spaced apart by a first distance; a third gate structure and a fourth gate structure formed on the substrate of the second region, the third gate structure and the fourth gate structure being spaced apart by a second distance different from the first distance; a first interlayer insulating film being on the substrate of the first region and including a first lower interlayer insulating film and a first upper interlayer insulating film on the first lower interlayer insulating film, the first lower interlayer insulating film surrounding a portion of a sidewall of the first gate structure, and a portion of a sidewall of the second gate structure; a second interlayer insulating film being on the substrate of the second region and including a second lower interlayer insulating film and a second upper interlayer insulating film on the second lower interlayer insulating film, the second lower interlayer insulating film surrounding a portion of a sidewall of the third gate structure, and a portion of a sidewall of the fourth gate structure; a first contact formed between the first gate structure and the second gate structure and within the first interlayer insulating film, the first contact having a first width; and a second contact formed between the third gate structure and the fourth gate structure and within the second interlayer insulating film, the second contact having a second width different from the first width, wherein the first width is based on an upper surface of the first gate structure, and the second width is based on an upper surface of the third gate structure.

In some example embodiments of the inventive concepts, the first lower interlayer insulating film is not interposed between the first upper interlayer insulating film and the sidewall of the first gate structure, and between the first upper interlayer insulating film and the sidewall of the second gate structure.

In some example embodiments of the inventive concepts, the first distance is greater than the second distance, and the first width is greater than the second width.

In some example embodiments of the inventive concepts, the semiconductor device may further comprise a first liner formed between the first lower interlayer insulating film and the sidewall of the first gate structure, and between the first lower interlayer insulating film and an upper surface of the substrate.

In some example embodiments of the inventive concepts, the first liner does not extend between the first upper interlayer insulating film and the sidewall of the first gate structure.

In some example embodiments of the inventive concepts, a height of an uppermost portion of the first liner on the sidewall of the first gate structure is lower than the height of the upper surface of the first gate structure.

In some example embodiments of the inventive concepts, the semiconductor device may further comprise a second liner formed between the second lower interlayer insulating film and the sidewall of the third gate structure, and between the second lower interlayer insulating film and the upper surface of the substrate.

In some example embodiments of the inventive concepts, the first contact contacts the first gate structure and the second gate structure, and the second contact contacts the third gate structure and the fourth gate structure.

In some example embodiments of the inventive concepts, the substrate further includes a third region. And the semiconductor device may further comprise a fifth gate structure and a sixth gate structure formed on the substrate of the third region, the fifth gate structure and the sixth gate structure being spaced apart by a third distance greater than the first distance and the second distance, and a third contact between the fifth gate structure and the sixth gate structure, the third contact having a third width.

In some example embodiments of the inventive concepts, the third width is greater than the first width and the second width.

In some example embodiments of the inventive concepts, the third width is substantially equal to one of the first width and the second width.

In example embodiments of the inventive concepts, the first contact contacts the first gate structure and the second gate structure, the second contact contacts the third gate structure and the fourth gate structure, and the third contact does not contact at least one of the fifth gate structure and the sixth gate structure.

In some example embodiments of the inventive concepts, a thickness of the first upper interlayer insulating film is substantially equal to a thickness of the second upper interlayer insulating film.

In some example embodiments of the inventive concepts, the first gate structure includes a first gate electrode, and the third gate structure includes a second gate electrode, and a sign of a slope of a sidewall of the first gate electrode is different from a sign of a slope of a sidewall of the second gate electrode.

In some example embodiments of the inventive concepts, the first gate structure includes a first gate electrode, and the third gate structure includes a second gate electrode, and a sign of a slope of a sidewall of the first gate electrode is same as a sign of a slope of a sidewall of the second gate electrode.

In some example embodiments of the inventive concepts, a ratio of a thickness of the first upper interlayer insulating film to a thickness of the first interlayer insulating film is different from a ratio of a thickness of the second upper interlayer insulating film to a thickness of the second interlayer insulating film.

In some example embodiments of the inventive concepts, the semiconductor device may further comprise a first source/drain formed between the first gate structure and the second gate structure, and a second source/drain formed between the third gate structure and the fourth gate structure. The first contact is connected with the first source/drain, and the second contact is connected with the second source/drain.

In some example embodiments of the inventive concepts, the first gate structure includes a gate spacer defining a trench, a gate insulating film being formed along a sidewall and a bottom surface of the trench, and a gate electrode being on the gate insulating film and filling the trench.

In some example embodiments of the inventive concepts, the semiconductor device may further comprise a first fin-type pattern and a second fin-type pattern protruding from the substrate. The first gate structure and the second gate structure intersect the first fin-type pattern, and the third gate structure and the fourth gate structure intersect the second fin-type pattern.

According to another example embodiment, a semiconductor device includes a substrate including a first region, and a second region; a first gate structure and a second gate structure formed on the substrate of the first region, the first gate structure and the second gate structure being spaced apart by a first distance; a third gate structure and a fourth gate structure formed on the substrate of the second region, the third gate structure and the fourth gate structure being spaced apart by a second distance greater than the first distance; a first liner extending along a portion of a sidewall of the first gate structure, an upper surface of the substrate, and a portion of a sidewall of the second gate structure; a second liner extending along a portion of a sidewall of the third gate structure, the upper surface of the substrate, and a portion of a sidewall of the fourth gate structure; a first interlayer insulating film being on the first liner and surrounding the sidewall of the first gate structure and the sidewall of the second gate structure; a second interlayer insulating film being on the second liner and surrounding the sidewall of the third gate structure and the sidewall of the fourth gate structure; a first contact formed between the first gate structure and the second gate structure and within the first interlayer insulating film, the first contact having a first width; and a second contact formed between the third gate structure and the fourth gate structure and within the second interlayer insulating film, the second contact having a second width greater than the first width, wherein the first width is based on or correlated to the width of an upper surface of the first gate structure, and the second width is based on or correlated to the width of an upper surface of the third gate structure.

In some example embodiments of the inventive concepts, the first interlayer insulating film includes a first lower interlayer insulating film on the first liner, and a first upper interlayer insulating film on the first lower interlayer insulating film, and the second interlayer insulating film includes a second lower interlayer insulating film on the second liner, and a second upper interlayer insulating film on the second lower interlayer insulating film.

In some example embodiments of the inventive concepts, the first lower interlayer insulating film is not interposed between the first upper interlayer insulating film and the sidewall of the first gate structure, and between the first upper interlayer insulating film and the sidewall of the second gate structure, and the second lower interlayer insulating film is not interposed between the second upper interlayer insulating film and the sidewall of the third gate structure, and between the second upper interlayer insulating film and the sidewall of the fourth gate structure.

In some example embodiments of the inventive concepts, a height of an uppermost portion of the first liner on the sidewall of the first gate structure is lower than the height of the upper surface of the first gate structure, and a height of an uppermost portion of the second liner on the sidewall of the third gate structure is lower than the height of the upper surface of the third gate structure.

In some example embodiments of the inventive concepts, a distance from the upper surface of the first gate structure to an uppermost portion of the first liner is substantially equal to a distance from the upper surface of the third gate structure to an uppermost portion of the second liner.

In some example embodiments of the inventive concepts, the first gate structure includes a first gate electrode, and the third gate structure includes a second gate electrode, and a sign of a slope of a sidewall of the first gate electrode is different from a sign of a slope of a sidewall of the second gate electrode.

In some example embodiments of the inventive concepts, a distance from the upper surface of the first gate structure to an uppermost portion of the first liner is greater than a distance from the upper surface of the third gate structure to an uppermost portion of the second liner.

In some example embodiments of the inventive concepts, the first gate structure includes a first gate electrode, and the third gate structure includes a second gate electrode, and a sign of a slope of a sidewall of the first gate electrode is same as a sign of a slope of a sidewall of the second gate electrode.

In some example embodiments of the inventive concepts, the sidewall of the first gate electrode and the sidewall of the second gate electrode are orthogonal to the upper surface of the substrate.

In some example embodiments of the inventive concepts, the first contact contacts the sidewall of the first gate structure and the sidewall of the second gate structure, and the second contact contacts the sidewall of the third gate structure and the sidewall of the fourth gate structure.

In some example embodiments of the inventive concepts, a width of the first contact and a width of the second contact increase as a distance from the upper surface of the substrate increases.

In some example embodiments of the inventive concepts, a width of the first contact decreases and then increases, and a width of the second contact increases, as a distance from the upper surface of the substrate increases.

According to still another example embodiments, a semiconductor device includes a substrate including a first region, and a second region; a first gate structure and a second gate structure formed on the substrate of the first region, the first gate structure and the second gate structure being spaced apart by a first distance; a third gate structure and a fourth gate structure formed on the substrate of the second region, the third gate structure and the fourth gate structure being spaced apart by a second distance lower than the first distance; a first liner formed along a sidewall of the first gate structure, an upper surface of the substrate, and a sidewall of the second gate structure, the first liner being not formed on an upper surface of the first gate structure and an upper surface of the second gate structure; a second liner formed along a sidewall of the third gate structure, the upper surface of the substrate, and a sidewall of the fourth gate structure, the second liner being not formed on an upper surface of the third gate structure and an upper surface of the fourth gate structure; a first interlayer insulating film being on the first liner and surrounding the sidewall of the first gate structure and the sidewall of the second gate structure; a second interlayer insulating film being on the second liner and surrounding the sidewall of the third gate structure and the sidewall of the fourth gate structure; a first contact formed between the first gate structure and the second gate structure and within the first interlayer insulating film, the first contact having a first width; and a second contact formed between the third gate structure and the fourth gate structure and within the second interlayer insulating film, the second contact having a second width lower than the first width, wherein the first width is based on or correlated to the width of the upper surface of the first gate structure, and the second width is based on or correlated to the width of the upper surface of the third gate structure.

In some example embodiments of the inventive concepts, a height from the upper surface of the substrate to an uppermost portion of the first liner is substantially equal to a height from the upper surface of the substrate to the upper surface of the first gate structure.

In some example embodiments of the inventive concepts, the first interlayer insulating film includes a first lower interlayer insulating film, and a first upper interlayer insulating film on the first lower interlayer insulating film, and the first lower interlayer insulating film is not interposed between the first upper interlayer insulating film and the sidewall of the first gate structure, and between the first upper interlayer insulating film and the sidewall of the second gate structure.

In some example embodiments of the inventive concepts, the first liner is formed on a portion of the sidewall of the first gate structure, and a portion of the sidewall of the second gate structure, and a height from the upper surface of the substrate to an uppermost portion of the second liner is substantially equal to a height from the upper surface of the substrate to an upper surface of the third gate structure.

In some example embodiments of the inventive concepts, a height of an uppermost portion of the first liner on the sidewall of the first gate structure is lower than the height of the upper surface of the first gate structure.

In some example embodiments of the inventive concepts, the second interlayer insulating film includes a second lower interlayer insulating film, and a second upper interlayer insulating film on the second lower interlayer insulating film, and the second lower interlayer insulating film is not interposed between the second upper interlayer insulating film and the sidewall of the third gate structure, and between the second upper interlayer insulating film and the sidewall of the fourth gate structure.

In some example embodiments of the inventive concepts, the first contact contacts the first gate structure and the second gate structure, and the second contact contacts the third gate structure and the fourth gate structure.

In some example embodiments of the inventive concepts, the first gate structure includes a gate spacer defining a trench, and a gate insulating film formed along a sidewall and a bottom surface of the trench.

According to still another example embodiments, a semiconductor device includes a gate structure being on a substrate and including a first sidewall and a second sidewall; a first source/drain being adjacent to the first sidewall of the gate structure; a second source/drain being adjacent to the second sidewall of the gate structure; a liner extending along the first sidewall of the gate structure, the second sidewall of the gate structure, an upper surface of the first source/drain, and an upper surface of the second source/drain; and a contact contacting the first sidewall of the gate structure and being connected with the first source/drain, wherein a height of the liner on the first sidewall of the gate structure is different from a height of the liner on the second sidewall of the gate structure.

In some example embodiments of the inventive concepts, the height of the liner on the first sidewall of the gate structure is lower than the height of the liner on the second sidewall of the gate structure.

In some example embodiments of the inventive concepts, the liner is formed on a portion of the first sidewall of the gate structure, and a portion of the second sidewall of the gate structure.

In some example embodiments of the inventive concepts, a contact contacting the second sidewall of the gate structure and being connected with the second source/drain is not formed.

In some example embodiments of the inventive concepts, the semiconductor device may further comprise an interlayer insulating film surrounding the second sidewall of the gate structure, and covering an upper surface of the liner.

In some example embodiments of the inventive concepts, a height from an upper surface of the substrate to an uppermost portion of the liner is lower than a height from the upper surface of the substrate to an upper surface of the interlayer insulating film.

In some example embodiments of the inventive concepts, the interlayer insulating film includes a lower interlayer insulating film on the liner, and an upper interlayer insulating film on the lower interlayer insulating film, and the lower interlayer insulating film is not interposed between the upper interlayer insulating film and the second sidewall of the gate structure.

In some example embodiments of the inventive concepts, a width of the contact increases as a distance from an upper surface of the substrate increases.

In some example embodiments of the inventive concepts, the gate structure includes a gate electrode, and a width of the gate electrode decreases as the distance from the upper surface of the substrate increases.

In some example embodiments of the inventive concepts, the gate structure includes a gate electrode, and a width of the gate electrode is substantially constant as the distance from the upper surface of the substrate increases.

In some example embodiments of the inventive concepts, a width of the contact decreases and then increases as a distance from an upper surface of the substrate increases.

In some example embodiments of the inventive concepts, the gate structure includes a gate spacer defining a trench, and a gate insulating film formed along a sidewall and a bottom surface of the trench.

In some example embodiments, a semiconductor device includes a substrate including a first region and a second region, a first gate structure and a second gate structure on the substrate at the first region, the first gate structure and the second gate structure being spaced apart by a first distance, a third gate structure and a fourth gate structure on the substrate at the second region, the third gate structure and the fourth gate structure being spaced apart by a second distance different from the first distance, a first contact between the first gate structure and the second gate structure, the first contact having a first width, and a second contact between the third gate structure and the fourth gate structure, the second contact having a second width, the first width being proportional to the first distance, and the second width being proportional to the second distance.

BRIEF DESCRIPTION OF THE DRAWINGS

The above and other objects, features and advantages of the example embodiments will become more apparent to those of ordinary skill in the art by describing in detail example embodiments thereof with reference to the accompanying drawings, in which.

DETAILED DESCRIPTION

Figure 1:
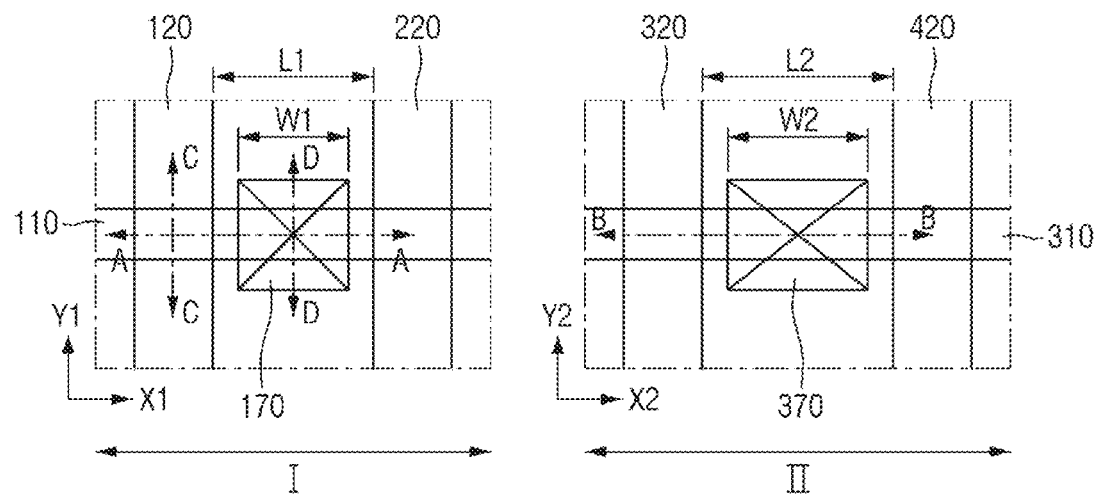
FIG. 1 is layout diagram provided to explain a semiconductor device according to some example embodiments.

Advantages and features of the inventive concepts and methods of accomplishing the same may be understood more readily by reference to the following detailed description of example embodiments and the accompanying drawings. The inventive concepts may, however, be embodied in many different forms and should not be construed as being limited to the embodiments set forth herein. Rather, these embodiments are provided so that this disclosure will be thorough and complete and will fully convey the concepts of the invention to those skilled in the art, and the inventive concepts will only be defined by the appended claims. In the drawings, the thickness of layers and regions are exaggerated for clarity.

It will be understood that when an element or layer is referred to as being "on," "connected to," or "coupled to" another element or layer, it can be directly on, directly connected to or coupled to another element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concepts.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless defined otherwise, all technical and scientific terms used herein have the same meaning as commonly understood by one of ordinary skill in the art to which this invention belongs. It is noted that the use of any and all examples, or example terms provided herein is intended merely to better illuminate the invention and is not a limitation on the scope of the invention unless otherwise specified. Further, unless defined otherwise, all terms defined in generally used dictionaries may not be overly interpreted.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Although the drawings regarding a semiconductor device according to some example embodiments exemplify a fin-type transistor (FinFET) comprising a channel region in a fin-type pattern shape, example embodiments are not limited thereto. It is of course possible that a semiconductor device according to some example embodiments may include a tunneling transistor (tunneling FET), a transistor comprising nanowire, a transistor comprising nano-sheet, or a three-dimensional (3D) transistor. Further, a semiconductor device according to some example embodiments may include a bipolar junction transistor, a laterally diffused metal oxide semiconductor (LDMOS) transistor, and so on.

Moreover, while a semiconductor device according to some example embodiments is exemplified as a multi-channel transistor using fin-type pattern, the semiconductor device may be a planar transistor as well.

Hereinbelow, a semiconductor device according to some example embodiments will be explained with reference to FIGS. 1 to 5B.

Figure 2:
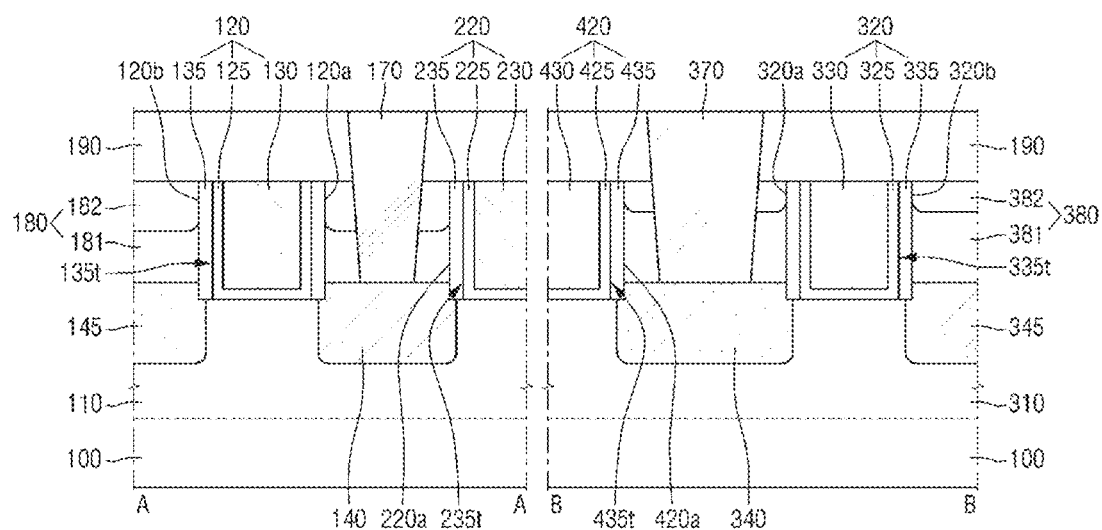
FIG. 2 is a cross sectional view taken on lines A-A and B-B of FIG. 1.
Figure 3:
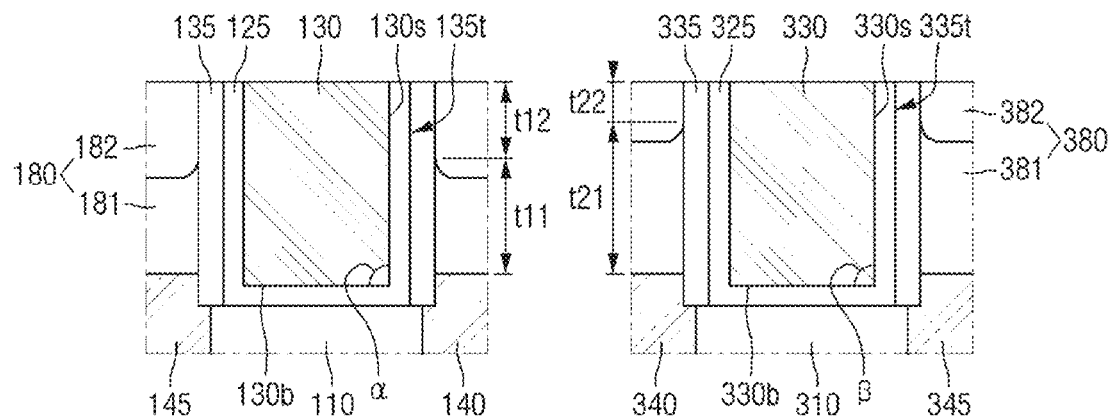
FIG. 3 illustrates the first gate structure portion and the third gate structure portion of FIG. 2 in enlargement.

FIG. 1 is a layout diagram provided to explain a semiconductor device according to some example embodiments. FIG. 2 is a cross sectional view taken on lines A-A and B-B of FIG. 1. FIG. 3 illustrates the first gate structure portion and the third gate structure portion of FIG. 2 in enlargement. FIGS. 4A to 4D are various examples of a cross sectional view taken on line C-C of FIG. 1. FIGS. 5A and 5B are various examples of a cross sectional view taken on line D-D of FIG. 1.

Referring to FIGS. 1 to 5B, the semiconductor device according to some example embodiments may include a first fin-type pattern 110, a second fin-type pattern 310, a first gate structure 120, a second gate structure 220, a third gate structure 320, a fourth gate structure 420, a first contact 170, and a second contact 370.

The substrate 100 may include a first region I and a second region II. The first region I and the second region II may be the regions that are spaced apart from each other, or connected with each other. Further, the transistor formed in the first region I and the transistor formed in the second region II may be of a same type, or different types from each other.

The substrate 100 may be a bulk silicon or a silicon-on-insulator (SOI). Alternatively, the substrate 100 may be a silicon substrate, or may include other substance such as, for example, silicon germanium, silicon germanium on insulator (SGOI), indium antimonide, lead telluride compound, indium arsenide, indium phosphide, gallium arsenide, or gallium antimonide, but not limited thereto.

In the first region I, the first fin-type pattern 110, the first gate structure 120, the second gate structure 220, and the first contact 170 may be formed.

The first fin-type pattern 110 may extend longitudinally on the substrate 100 and in a first direction X1. The first fin-type pattern 110 may protrude from the substrate 100.

The first fin-type pattern 110 may be a part of the substrate 100, and may include an epitaxial layer grown from the substrate 100.

The first fin-type pattern 110 may include an element semiconductor material such as silicon or germanium, for example. Further, the first fin-type pattern 110 may include a compound semiconductor such as, for example, IV-IV group compound semiconductor or III-V group compound semiconductor.

Specifically, take the IV-IV group compound semiconductor for instance, the first fin-type pattern 110 may be a binary compound or a ternary compound including, for example, at least two or more of carbon (C), silicon (Si), germanium (Ge), or tin (Sn), or the above-mentioned binary or ternary compound doped with a IV group element.

Take the III-V group compound semiconductor for instance, the first fin-type pattern 110 may be one of a binary compound, a ternary compound or a quaternary compound which is formed by a combination of a III group element which may be at least one of aluminum (Al), gallium (Ga), or indium (In), with a V group element which may be one of phosphorus (P), arsenic (As) or antimony (Sb).

In the semiconductor device according to some example embodiments, it is assumed that the first fin-type pattern 110 is a silicon fin-type pattern.

The field insulating film 105 may be formed to surround a portion of the first fin-type pattern 110. The first fin-type pattern 110 may be defined by the field insulating film 105. Accordingly, a portion of the first fin-type pattern 110 may protrude upward higher than an upper surface of the field insulating film 105.

The field insulating film 105 may include, for example, an oxide film, a nitride film, an oxynitride film, or a film combining an oxide film, a nitride film, an oxynitride film.

Figure 4A:
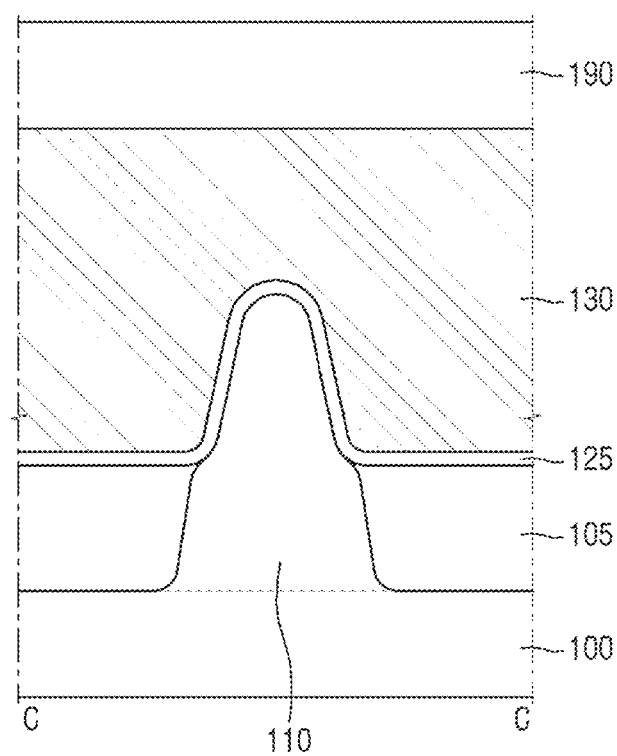
FIGS. 4A to 4D are various examples of a cross sectional view taken on line C-C of FIG. 1.
Figure 4B:
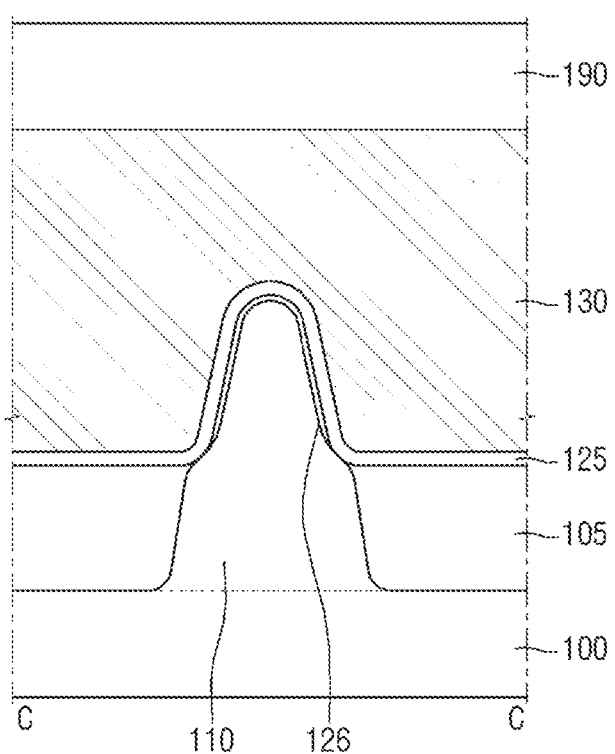
Figure 4C:
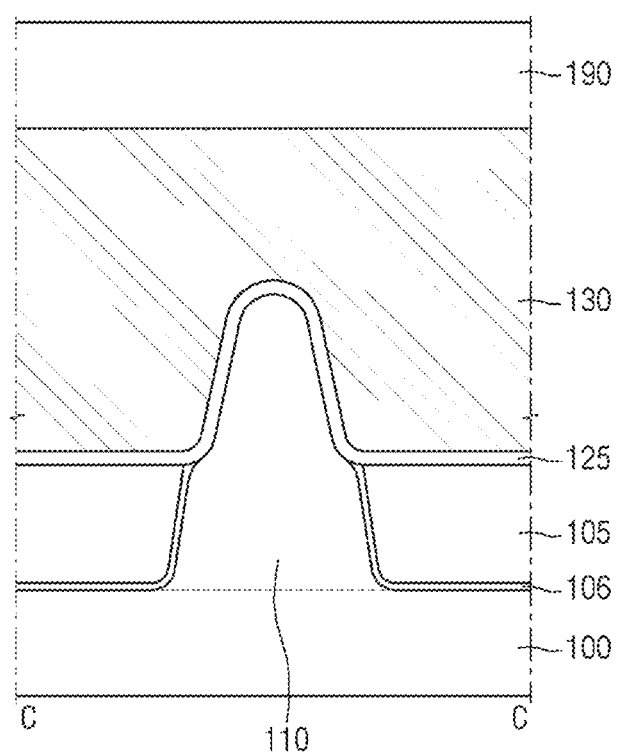
Figure 5A:
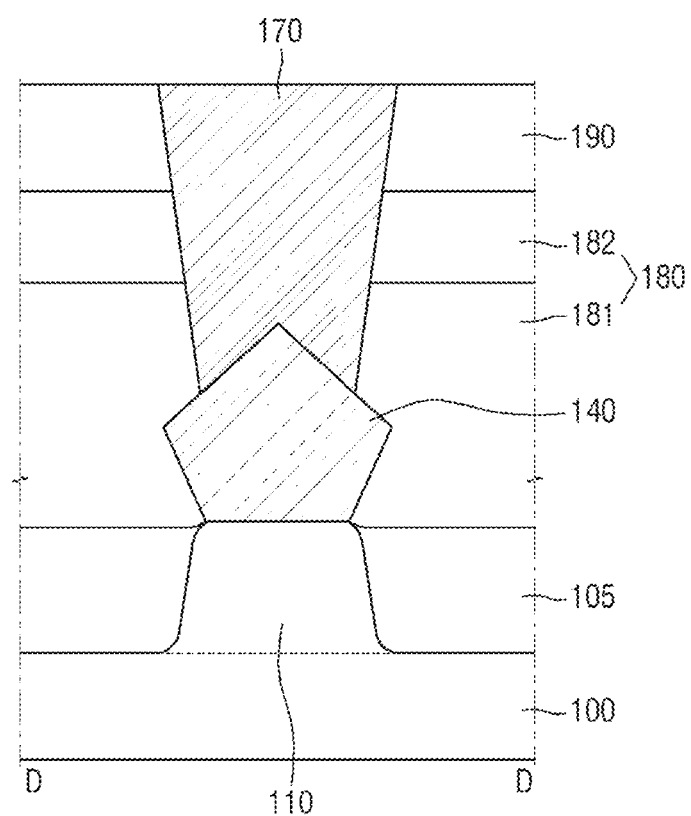
FIGS. 5A and 5B are various examples of a cross sectional view taken on line D-D of FIG. 1.
Figure 5B:
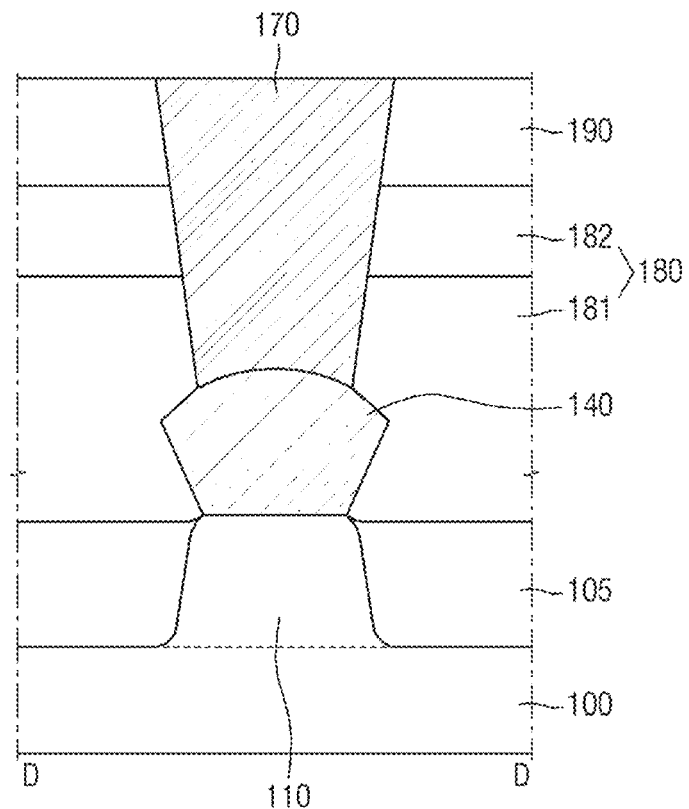

Unlike FIG. 4A, in FIG. 4C, a first field liner 106 may be additionally formed between the field insulating film 105 and the first fin-type pattern 110, and between the field insulating film 105 and the substrate 100.

The first field liner 106 may be formed along a sidewall of the first fin-type pattern 110 surrounded by the field insulating film 105, and along an upper surface of the substrate 100. The first field liner 106 may not protrude upward higher than an upper surface of the field insulating film 105.

The first field liner 106 may include at least one of, for example, polysilicon, amorphous silicon, silicon oxynitride, silicon nitride, or silicon oxide.

Figure 4D:
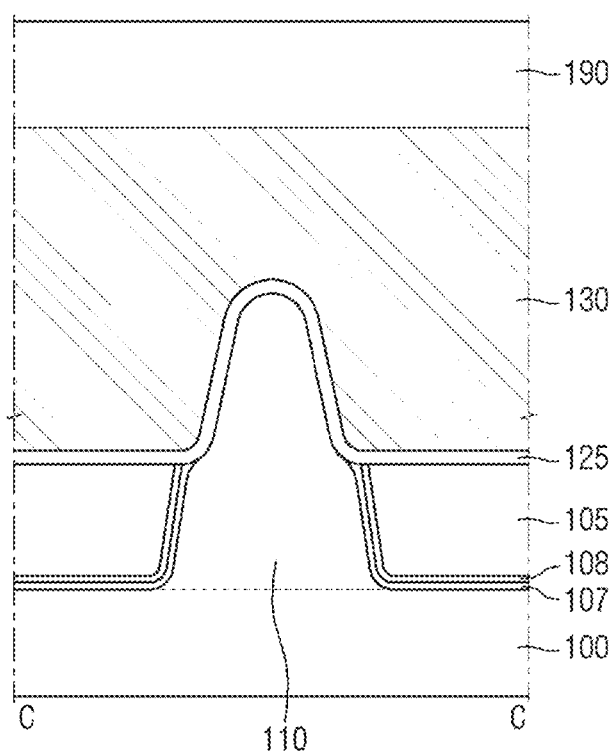

Further, unlike FIG. 4A, in FIG. 4D, a second field liner 107 and a third field liner 108 may be additionally formed between the field insulating film 105 and the first fin-type pattern 110, and between the field insulating film 105 and the substrate 100.

The second field liner 107 may be formed along the sidewall of the first fin-type pattern 110 surrounded by the field insulating film 105, and along the upper surface of the substrate 100.

The third field liner 108 may be formed on the second field liner 107. The third field liner 108 may be formed along the second field liner 107.

The second field liner 107 may include, for example, polysilicon or amorphous silicon. The third field liner 108 may include, for example, silicon oxide.

The first gate structure 120 may extend in a second direction Y1. The first gate structure 120 may be formed to intersect the first fin-type pattern 110.

The first gate structure 120 may include a first gate electrode 130, a first gate insulating film 125, and a first gate spacer 135.

The second gate structure 220 may extend in the second direction Y1. The second gate structure 220 may be formed to intersect the first fin-type pattern 110. The second gate structure 220 may be spaced apart from the first gate structure 120 by a first distance L1.

The second gate structure 220 may include a second gate electrode 230, a second gate insulating film 225, and a second gate spacer 235.

The first gate spacer 135 and the second gate spacer 235 may be formed on the first fin-type pattern 110, respectively. The first gate spacer 135 may define a first trench 135t extending in the second direction Y1. The second gate spacer 235 may define a second trench 235t extending in the second direction Y1.

An outer sidewall of the first gate spacer 135 may be a first sidewall 120a of the first gate structure and a second sidewall 120b of the first gate structure that extend in the second direction Y1. Further, an outer sidewall of the second gate spacer 235 may be a sidewall 220a of the second gate structure.

Further, depending on examples, the first gate spacer 135 and the second gate spacer 235 may serve as the guides to form self-aligned contacts. Accordingly, the first gate spacer 135 and the second gate spacer 235 may include a material having etch selectivity with respect to a first interlayer insulating film 180 which will be described below.

The first gate spacer 135 and the second gate spacer 235 may each include at least one of, for example, silicon nitride (SiN), silicon oxynitride (SiON), silicon dioxide ($SiO_2$), silicon oxycarbonitride (SiOCN), and a combination thereof.

As illustrated, the first gate spacer 135 and the second gate spacer 235 may each be a single film. However, this is provided only for convenience of illustration and example embodiments are not limited thereto.

When the first gate spacer 135 and the second gate spacer 235 are a plurality of films, at least one of the films of the first gate spacer 135 and the second gate spacer 235 may include a low-k dielectric material such as silicon oxycarbonitride (SiOCN).

Further, when the first gate spacer 135 and the second gate spacer 235 are a plurality of films, at least one of the films of the first gate spacer 135 and the second gate spacer 235 may have a L-shape.

Further, when the first gate spacer 135 and the second gate spacer 235 are a plurality of films, the first gate spacer 135 and the second gate spacer 235 may each be a combination of an L-shaped film and an I-shaped film.

The first gate insulating film 125 may be formed on the first fin-type pattern 110 and the field insulating film 105. The first gate insulating film 125 may be formed along the sidewall and the bottom surface of the first trench 135t. The first gate insulating film 125 may be formed along a profile of the first fin-type pattern 110 protruding upward higher than the field insulating film 105, and along the upper surface of the field insulating film 105 and the inner sidewall of the first gate spacer 135.

Further, an interfacial layer 126 may be additionally formed between the first gate insulating film 125 and the first fin-type pattern 110. Although not illustrated, referring to FIG. 2, an interfacial layer may also be additionally formed between the first gate insulating film 125 and the first fin-type pattern 110.

As illustrated in FIG. 4B, the interfacial layer 126 may be formed along the profile of the first fin-type pattern 110 that protrudes higher than the upper surface of the field insulating film 105, although example embodiments are not limited thereto.

The interfacial layer 126 may extend along the upper surface of the field insulating film 105 according to a method used for forming the interfacial layer 126.

Hereinbelow, example embodiments are explained by referring to drawings in which illustration of the interfacial layer 126 is omitted for convenience of explanation.

The second gate insulating film 225 may be formed on the first fin-type pattern 110. The second gate insulating film 225 may be formed along the sidewall and the bottom surface of the second trench 235t.

Description of the second gate insulating film 225 may be similar to or the same as that of the first gate insulating film 125, and will not be redundantly described below.

The first gate insulating film 125 and the second gate insulating film 225 may each include, for example, at least one of silicon oxide, silicon oxynitride, silicon nitride, or a high-k dielectric material with a higher dielectric constant than silicon oxide.

For example, the high-k dielectric material may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Further, while the high-k dielectric material described above is explained main with reference to oxides, alternatively, the high-k dielectric material may include one or more of the nitride (e.g., hafnium nitride) or the oxynitride (e.g., hafnium oxynitride) of the metal materials described above, but not limited thereto.

The first gate electrode 130 may be formed on the first gate insulating film 125. The first gate electrode 130 may fill the first trench 135t.

The second gate electrode 230 may be formed on the second gate insulating film 225. The second gate electrode 230 may fill the second trench 235t.

As illustrated, the first gate electrode 130 and the second gate electrode 230 may be single films. However, this is provided only for convenience of illustration and example embodiments are not limited thereto. That is, it is of course possible that the first gate electrode 130 and the second gate electrode 230 may each include a plurality of films such as a barrier film, a work function adjustment film, a filling film, and so on.

The first gate electrode 130 and the second gate electrode 230 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantlum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), sinc (Zn), vanadium (V), and a combination thereof.

The first gate electrode 130 and the second gate electrode 230 may each include a conductive metal oxide, a conductive metal oxynitride, and so on, and an oxidized form of the materials described above.

The first source/drain 140 may be formed between the first gate structure 120 and the second gate structure 220. The first source/drain 140 may be formed adjacent to the first sidewall 120a of the first gate structure.

The second source/drain 145 may be formed adjacent to the second sidewall 120b of the first gate structure.

As illustrated, the first source/drain 140 and the second source/drain 145 may include an epitaxial layer formed within the first fin-type pattern 110, although example embodiments are not limited thereto. The first source/drain 140 and the second source/drain 145 may be impurity regions formed within the first fin-type pattern 110, and may include an epitaxial layer formed along a profile of the first fin-type pattern 110.

For example, the first source/drain 140 and the second source/drain 145 may be raised source/drains.

As illustrated in FIGS. 5A and 5B, the first source/drain 140 may not include an outer circumference extending along the upper surface of the field insulating film 105, but this is provided only for convenience of explanation and the example embodiments are not limited thereto. That is, the first source/drain 140 may include an outer circumference extending along the upper surface of the field insulating film 105 and being in surface-contact with the field insulating film 105.

When the semiconductor device in the first region I according to some example embodiments is a PMOS transistor, the first source/drain 140 and the second source/drain 145 may include a compressive stress material. For example, the compressive stress material may be a material such as SiGe that has a higher lattice constant compared to Si. For example, the compressive stress material can enhance mobility of the carrier in the channel region by exerting compressive stress on the first fin-type pattern 110.

Alternatively, when the semiconductor device in the first region I according to some example embodiments is an NMOS transistor, the first source/drain 140 and the second source/drain 145 may include a tensile stress material. For example, when the first fin-type pattern 110 is silicon, the first source/drain 140 and the second source/drain 145 may be a material such as SiC that has a smaller lattice constant than the silicon. For example, the tensile stress material can enhance mobility of the carrier in the channel region by exerting tensile stress on the first fin-type pattern 110.

Meanwhile, when the semiconductor device in the first region I according to some example embodiments is an NMOS transistor, the first source/drain 140 and the second source/drain 145 may include a same material as the first fin-type pattern 110, i.e., silicon.

In the second region II, the second fin-type pattern 310, the third gate structure 320, the fourth gate structure 420, and the second contact 370 may be formed.

The second fin-type pattern 310 may extend longitudinally on the substrate 100 in a third direction X2. The second fin-type pattern 310 may protrude from the substrate 100.

The second fin-type pattern 310 may be a part of the substrate 100, and may include an epitaxial layer grown from the substrate 100.

Like the first fin-type pattern 110, the second fin-type pattern 310 may include a variety of semiconductor materials. However, in the semiconductor device according to some example embodiments, it is assumed that the second fin-type pattern 310 is a silicon fin-type pattern.

The third gate structure 320 may extend in a fourth direction Y2. The third gate structure 320 may be formed to intersect the second fin-type pattern 310.

The third gate structure 320 may include a third gate electrode 330, a third gate insulating film 325, and a third gate spacer 335.

The fourth gate structure 420 may extend in the fourth direction Y2. The fourth gate structure 420 may be formed to intersect the second fin-type pattern 310. The fourth gate structure 420 may be spaced apart from the third gate structure 320 by a second distance L2.

The fourth gate structure 420 may include a fourth gate electrode 430, a fourth gate insulating film 425, and a fourth gate spacer 435.

The third gate spacer 335 and the fourth gate spacer 435 may be formed on the second fin-type pattern 310, respectively. The third gate spacer 335 may define a third trench 335t extending in the fourth direction Y2. The fourth gate spacer 435 may define a fourth trench 435t extending in the fourth direction Y2.

An outer sidewall of the third gate spacer 335 may be a first sidewall 320a of the third gate structure and a second sidewall 320b of the third gate structure that extend in the fourth direction Y2. Further, an outer sidewall of the fourth gate spacer 435 may be a sidewall 420a of the fourth gate structure.

Description about the third gate spacer 335 and the fourth gate spacer 435 may be substantially similar to or the same as the description about the first gate spacer 135 and the second gate spacer 235, and therefore, will not be redundantly described below.

The third gate insulating film 325 may be formed on the second fin-type pattern 310. The third gate insulating film 325 may be formed along the sidewall and a bottom surface of the third trench 335t.

The fourth gate insulating film 425 may be formed on the second fin-type pattern 310. The fourth gate insulating film 425 may be formed along the sidewall and the bottom surface of the fourth trench 435t.

Description of the third gate insulating film 325 and the fourth gate insulating film 425 may be substantially similar to or the same as that of the first gate insulating film 125, and therefore, will not be redundantly described below.

The third gate insulating film 325 and the fourth gate insulating film 425 may each include, for example, at least one of silicon oxide, silicon oxynitride, silicon nitride, or a high-k dielectric material with a higher dielectric constant than silicon oxide.

The third gate electrode 330 may be formed on the third gate insulating film 325. The third gate electrode 330 may fill the third trench 335t.

The fourth gate electrode 430 may be formed on the fourth gate insulating film 425. The fourth gate electrode 430 may fill the fourth trench 435t.

The materials and stack structures of the third gate electrode 330 and the fourth gate electrode 430 will not be redundantly described below, as the description may be substantially similar to or the same as that of the first gate electrode 130 and the second gate electrode 230.

The third source/drain 340 may be formed between the third gate structure 320 and the fourth gate structure 420. The third source/drain 340 may be formed adjacent to the first sidewall 320a of the third gate structure.

The fourth source/drain 345 may be formed adjacent to the second sidewall 320b of the third gate structure.

As illustrated, the third source/drain 340 and the fourth source/drain 345 may include an epitaxial layer formed within the second fin-type pattern 310, although example embodiments are not limited thereto. The third source/drain 340 and the fourth source/drain 345 may be impurity regions formed within the second fin-type pattern 310, and may include an epitaxial layer formed along a profile of the second fin-type pattern 310.

For example, the third source/drain 340 and the fourth source/drain 345 may be raised source/drains.

When the semiconductor device in the second region II according to some example embodiments is a PMOS transistor, the third source/drain 340 and the fourth source/drain 345 may include a compressive stress material. For example, the compressive stress material may be a material such as SiGe that has a higher lattice constant compared to Si. For example, the compressive stress material can enhance carrier mobility in the channel region by exerting compressive stress on the second fin-type pattern 310.

Alternatively, when the semiconductor device in the second region II according to some example embodiments is an NMOS transistor, the third source/drain 340 and the fourth source/drain 345 may include a tensile stress material. For example, when the first fin-type pattern 310 is silicon, the third source/drain 340 and the fourth source/drain 345 may be a material such as SiC that has a smaller lattice constant than silicon. For example, the tensile stress material can enhance carrier mobility in the channel region by exerting tensile stress on the second fin-type pattern 310.

Meanwhile, when the semiconductor device in the second region II according to some example embodiments is an NMOS transistor, the third source/drain 340 and the fourth source/drain 345 may include a same material as the second fin-type pattern 310, i.e., silicon.

The first interlayer insulating film 180 may be formed on the substrate 100 of the first region I. The first interlayer insulating film 180 may cover the first fin-type pattern 110, the first source/drain 140, and the second source/drain 145.

The first interlayer insulating film 180 may surround the first sidewall 120a of the first gate structure, the second sidewall 120b of the first gate structure, and the sidewall 220a of the second gate structure.

The upper surface of the first interlayer insulating film 180 may be in the same plane as the upper surface of the first gate structure 120 and the upper surface of the second gate structure 220.

The first interlayer insulating film 180 may include a first lower interlayer insulating film 181 and a first upper interlayer insulating film 182 stacked on the substrate 100 in a sequential order.

The first lower interlayer insulating film 181 may be formed on the first fin-type pattern 110. The first lower interlayer insulating film 181 may surround a portion of the first sidewall 120a of the first gate structure, a portion of the second sidewall 120b of the first gate structure, and a portion of the sidewall 220a of the second gate structure.

For example, the first lower interlayer insulating film 181 may include silicon oxide, silicon oxynitride, silicon nitride, flowable oxide (FOX), Tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The first upper interlayer insulating film 182 may be formed on the first lower interlayer insulating film 181. The first upper interlayer insulating film 182 may surround the first sidewall 120a of the first gate structure, the second sidewall 120b of the first gate structure, and the sidewall 220a of the second gate structure that are not surrounded by the first lower interlayer insulating film 181.

For example, the first upper interlayer insulating film 182 may include silicon oxide, silicon oxynitride, silicon nitride, flowable oxide (FOX), Tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The first lower interlayer insulating film 181 is not interposed between the first upper interlayer insulating film 182 and the sidewalls 120a, 120b of the first gate structure, nor between the first upper interlayer insulating film 182 and the sidewall 220a of the second gate structure.

The first lower interlayer insulating film 181 may surround the sidewall of the first gate structure 120 to a height that corresponds to the thickness t11 of the first lower interlayer insulating film 181. Further, the first upper interlayer insulating film 182 may surround the sidewall of the first gate structure 120 to a height that corresponds to the thickness t12 of the first upper interlayer insulating film 182.

Further, the boundary surface between the first lower interlayer insulating film 181 and the first upper interlayer insulating film 182 may be a curved surface, for example. When forming the first lower interlayer insulating film 181 by using dry etch process and then forming the first upper interlayer insulating film 182 on the first lower interlayer insulating film 181, the boundary surface between the first lower interlayer insulating film 181 and the first upper interlayer insulating film 182 may be a curved surface.

The second interlayer insulating film 380 may be formed on the substrate 100 of the second region II. The second interlayer insulating film 380 may cover the second fin-type pattern 310, the third source/drain 340, and the fourth source/drain 345.

The second interlayer insulating film 380 may surround the first sidewall 320a of the third gate structure, the second sidewall 320b of the third gate structure, and the sidewall 420a of the fourth gate structure 420.

The upper surface of the second interlayer insulating film 380 may be in the same plane as, for example, the upper surface of the third gate structure 320 and the upper surface of the fourth gate structure 420.

The second interlayer insulating film 380 may include a second lower interlayer insulating film 381 and a second upper interlayer insulating film 382 stacked on the substrate 100 in a sequential order.

The second lower interlayer insulating film 381 may be formed on the second fin-type pattern 310. The second lower interlayer insulating film 381 may surround a portion of the first sidewall 320a of the third gate structure, a portion of the second sidewall 320b of the third gate structure, and a portion of the sidewall 420a of the fourth gate structure.

The second upper interlayer insulating film 382 may be formed on the second lower interlayer insulating film 381. The second upper interlayer insulating film 382 may surround the first sidewall 320a of the third gate structure, the second sidewall 320b of the third gate structure, and the sidewall 420a of the fourth gate structure that are not surrounded by the second lower interlayer insulating film 381.

The second lower interlayer insulating film 381 is not interposed between the second upper interlayer insulating film 382 and the sidewalls 320a, 320b of the third gate structure, nor between the second upper interlayer insulating film 382 and the sidewall 420a of the fourth gate structure.

The second lower interlayer insulating film 381 may surround the sidewall of the third gate structure 320 to a height that corresponds to the thickness t21 of the second lower interlayer insulating film 381. Further, the second upper interlayer insulating film 382 may surround the sidewall of the third gate structure 320 to a height that corresponds to the thickness t22 of the second upper interlayer insulating film 382.

Further, the boundary surface between the second lower interlayer insulating film 381 and the second upper interlayer insulating film 382 may be a curved surface, for example.

The second lower interlayer insulating film 381 may include a same material as the first lower interlayer insulating film 181.

Hereinbelow, it is assumed that the second upper interlayer insulating film 382 includes the same material as the first upper interlayer insulating film 182, but example embodiments are not limited thereto.

A third interlayer insulating film 190 may be formed on the first interlayer insulating film 180 and the second interlayer insulating film 380. The third interlayer insulating film 190 may be formed on the first region I and the second region II of the substrate 100, for example.

For example, the third interlayer insulating film 190 may include silicon oxide, silicon oxynitride, silicon nitride, flowable oxide (FOX), Tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

The first contact 170 may be formed between the first gate structure 120 and the second gate structure 220. The first contact 170 may be formed adjacent to the first sidewall 120a of the first gate structure.

The first contact 170 may be formed within the third interlayer insulating film 190 and the first interlayer insulating film 180. The first contact 170 may not contact the first gate structure 120 and the second gate structure 220. The first contact 170 may be connected with the first source/drain 140.

The first contact 170 may have a first width W1. For example, the first width W1 of the first contact 170 may be based on or correlated to the respective widths of the upper surface of the first gate structure 120 and the upper surface of the second gate structure 220, but this is provided only for convenience of explanation and example embodiments are not limited thereto. That is, the first width W1 of the first contact 170 may be based on the width of the upper surface of the third interlayer insulating film 190.

Further, the first width W1 of the first contact 170 may be a width in the first direction X1.

Referring to FIG. 5A, the boundary surface between the first contact 170 and the first source/drain 140 may be a facet of an epitaxial layer included in the first source/drain 140.

Alternatively, referring to FIG. 5B, the boundary surface between the first contact 170 and the first source/drain 140 may be a curved surface. The boundary surface between the first contact 170 and the first source/drain 140 may depend on which etch process is used for the contact hole forming process to form the first contact 170.

Although not illustrated in FIGS. 5A and 5B, a silicide layer may be additionally formed between the first contact 170 and the first source/drain 140.

The second contact 370 may be formed between the third gate structure 320 and the fourth gate structure 420. The second contact 370 may be formed adjacent to the first sidewall 320a of the third gate structure.

The second contact 370 may be formed within the third interlayer insulating film 190 and the second interlayer insulating film 380. The second contact 370 may not contact the third gate structure 320 and the fourth gate structure 420. The second contact 370 may be connected with the third source/drain 340.

The second contact 370 may have a second width W2. For example, the second width W2 of the second contact 370 may be based on the upper surface of the third gate structure 320 and the upper surface of the fourth gate structure 420. Further, the second width W2 of the second contact 370 may be a width in the third direction X2.

The boundary surface between the second contact 370 and the third source/drain 340 may be similar or the same as the one illustrated in FIGS. 5A and 5B.

The first contact 170 and the second contact 370 may include at least one of, for example, tantalum (Ta), tantalum nitride (TaN), titanium (Ti), titanium nitride (TiN), ruthenium (Ru), cobalt (Co), nickel (Ni), nickel boride (NiB), tungsten nitride (WN), aluminum (Al), tungsten (W), copper (Cu), cobalt (Co) or doped polysilicon.

While the first contact 170 and the second contact 370 are illustrated to be a single pattern, this is only for convenience of explanation and the example embodiments are not limited thereto. The first contact 170 and the second contact 370 may each include a barrier film, and a filling film formed on the barrier film.

The first distance L1 of spacing between the first gate structure 120 and the second gate structure 220 may be different from the second distance L2 of spacing between the third gate structure 320 and the fourth gate structure 420. Further, the first width W1 of the first contact 170 may be different from the second width W2 of the second contact 370.

For example, the first distance L1 of spacing between the first gate structure 120 and the second gate structure 220 may be lower than the second distance L2 of spacing between the third gate structure 320 and the fourth gate structure 420. Further, the first width W1 of the first contact 170 may be lower than the second width W2 of the second contact 370.

In other words, in a semiconductor device according to some example embodiments, the width of the contacts formed between gate structures may increase as the distances between adjacent gate structures increase.

In a semiconductor device according to an example embodiment, the stress characteristic of the first lower interlayer insulating film 181 may be different from the stress characteristic of the first upper interlayer insulating film 182. Further, the stress characteristic of the second lower interlayer insulating film 381 may be different from the stress characteristic of the second upper interlayer insulating film 382.

More specifically, for example, when the first lower interlayer insulating film 181 has a tensile stress characteristic, the first upper interlayer insulating film 182 may have a compressive stress characteristic. On the contrary, when the first lower interlayer insulating film 181 has a compressive stress characteristic, the first upper interlayer insulating film 182 may have a tensile stress characteristic.

The expression "tensile stress characteristic" as used herein refers to the interlayer insulating film having a tension that pulls the gate electrode or the gate spacers toward the interlayer insulating film.

More specifically, by the interlayer insulating film having the tensile stress characteristic, the gate spacers are subject to a force that acts in a direction from the gate electrode to the interlayer insulating film.

On the contrary, by the interlayer insulating film having the compressive stress characteristic, the gate spacers are subject to a force that acts in a direction from the interlayer insulating film to the gate electrode.

Because the first interlayer insulating film 180 may include the first lower interlayer insulating film 181 and the first upper interlayer insulating film 182 having different stress characteristics from each other, the overall stress characteristic of the first interlayer insulating film 180 may vary according to differences in thickness, volume, and so on between the first lower interlayer insulating film 181 and the first upper interlayer insulating film 182.

Additionally, the first lower interlayer insulating film 181 and the first upper interlayer insulating film 182 may include different materials from each other, or alternatively, may include the same material as each other.

When the first lower interlayer insulating film 181 and the first upper interlayer insulating film 182 include a material same as each other, the conditions for forming the first lower interlayer insulating film 181, including heat treatment condition, and the conditions for forming the first upper interlayer insulating film 182, including heat treatment condition, may be different from each other. Accordingly, the first lower interlayer insulating film 181 and the first upper interlayer insulating film can have different stress characteristics from each other.

The example in which the first lower interlayer insulating film 181 and the first upper interlayer insulating film 182 include the same material will be described with reference to FIG. 13 and others.

The second lower interlayer insulating film 381 may have the same material and may be subject to the same post-processing as the first lower interlayer insulating film 181. Accordingly, the second lower interlayer insulating film 381 may have the same stress characteristic as the first lower interlayer insulating film 181.

For convenience of explanation, it is assumed hereinbelow that the first lower interlayer insulating film 181 and the second lower interlayer insulating film 381 have tensile stress characteristic, and the first upper interlayer insulating film 182 and the second upper interlayer insulating film 382 have compressive stress characteristic.

Referring to FIG. 3, the first gate electrode 130 includes a sidewall 130s and a bottom surface 130b. The third gate electrode 330 includes a sidewall 330s and a bottom surface 330b.

The sidewall 130s of the first gate electrode may make a first angle α with respect to the bottom surface 130b of the first gate electrode. The sidewall 330s of the third gate electrode may make a second angle β with respect to the bottom surface 330b of the third gate electrode.

In this case, the first angle α of the sidewall 130s of the first gate electrode with respect to the bottom surface 130b of the first gate electrode may be a right angle, and the second angle β of the sidewall 330s of the third gate electrode with respect to the bottom surface 330b of the third gate electrode may be a right angle.

In other words, the width of the first gate electrode 130 and the width of the third gate electrode 330 may be constant as the distance from the upper surface of the substrate 100 increases. The width of the first gate electrode 130 may be constant as the distance from the bottom surface 130b of the first gate electrode increases, and the width of the third gate electrode 330 may be constant as the distance from the bottom surface 330b of the third gate electrode increases.

Additionally, the slope of the sidewall 130s of the first gate electrode and the slope of the sidewall 330s of the third gate electrode may have the same sign.

As an alternative embodiment, the point where the sidewall 130s of the first gate electrode and the bottom surface 130b of the first gate electrode meet, and the point where the sidewall 330s of the third gate electrode and the bottom surface 330b of the third gate electrode meet, may be rounded. However, even in such examples, it is apparent that those skilled in the art will be able to obtain the slope of the sidewall 130s of the first gate electrode and the slope of the sidewall 330s of the third gate electrode.

Meanwhile, as an alternative to the illustration in FIG. 3, the first angle α of the sidewall 130s of the first gate electrode with respect to the bottom surface 130b of the first gate electrode, and the second angle β of the sidewall 330s of the third gate electrode with respect to the bottom surface 330b of the third gate electrode may both be obtuse angles or acute angles. Even in the above example, the sign of the slope of the sidewall 130s of the first gate electrode, and the sign of the slope of the sidewall 330s of the third gate electrode may still be identical.

When both the first angle α of the sidewall 130s of the first gate electrode with respect to the bottom surface 130b of the first gate electrode, and the second angle β of the sidewall 330s of the third gate electrode with respect to the bottom surface 330b of the third gate electrode are obtuse angles, it is defined herein that both the sign of the slope of the sidewall 130s of the first gate electrode and the sign of the slope of the sidewall 330s of the third gate electrode are positive signs.

If the situation is opposite the example described above, then it is defined herein that the sign of the slope of the sidewall 130s of the first gate electrode and the sign of the slope of the sidewall 330s of the third gate electrode are negative signs.

When both the slope of the sidewall 130s of the first gate electrode and the slope of the sidewall 330s of the third gate electrode have positive signs, the width of the first gate electrode 130 and the width of the third gate electrode 330 may increase as the distance from the upper surface of the substrate 100 increases.

On the contrary, when both the slope of the sidewall 130s of the first gate electrode and the slope of the sidewall 330s of the third gate electrode have negative signs, the width of the first gate electrode 130 and the width of the third gate electrode 330 may decrease as the distance from the upper surface of the substrate 100 increases.

When both the slope of the sidewall 130s of the first gate electrode and the slope of the sidewall 330s of the third gate electrode have the same sign, the stress characteristic of the first interlayer insulating film 180 and the stress characteristic of the second interlayer insulating film 380 may be identical.

The first distance L1 between the first gate structure 120 and the second gate structure 220 may be lower than the second distance L2 between the third gate structure 320 and the fourth gate structure 420. In this case, when the thickness t12 of the first upper interlayer insulating film 182 and the thickness t22 of the second upper interlayer insulating film 382 are substantially equal, because the second upper interlayer insulating film 382 has a greater volume than the volume of the first upper interlayer insulating film 182, the compressive stress of the second upper interlayer insulating film 382 becomes greater than the compressive stress of the first upper interlayer insulating film 182.

In such example, the compressive stress exerted by the second interlayer insulating film 380 to the third gate structure 320 becomes greater than the compressive stress exerted by the first interlayer insulating film 180 to the first gate structure 120. Accordingly, the stress characteristic of the first interlayer insulating film 180 and the stress characteristic of the second interlayer insulating film 380 cannot be identical.

Accordingly, when both the slope of the sidewall 130s of the first gate electrode and the slope of the sidewall 330s of the third gate electrode have the same sign, the thickness t12 of the first upper interlayer insulating film 182 and the thickness t22 of the second upper interlayer insulating film 382 may be different. For example, the thickness t12 of the first upper interlayer insulating film 182 may be thicker than the thickness t22 of the second upper interlayer insulating film 382.

As a result, the stress characteristic of the first interlayer insulating film 180 and the stress characteristic of the second interlayer insulating film 380 may be equally obtained.

In other words, the ratio of the thickness t12 of the first upper interlayer insulating film 182 to the thickness (t11+t12) of the first interlayer insulating film 180, and the ratio of the thickness t22 of the second upper interlayer insulating film 382 to the thickness (t21+t22) of the second interlayer insulating film 380 may be varied from each other, so that the stress characteristic of the first interlayer insulating film 180 and the stress characteristic of the second interlayer insulating film 380 may be equally obtained.

That is, by varying the ratio of the thickness t12 of the first upper interlayer insulating film 182 to the thickness (t11+t12) of the first interlayer insulating film 180, and the ratio of the thickness t22 of the second upper interlayer insulating film 382 to the thickness (t21+t22) of the second interlayer insulating film 380 from each other, it is possible to equalize the sign of the slope of the sidewall 130s of the first gate electrode and the sign of the slope of the sidewall 330s of the third gate electrode.

Figure 6:
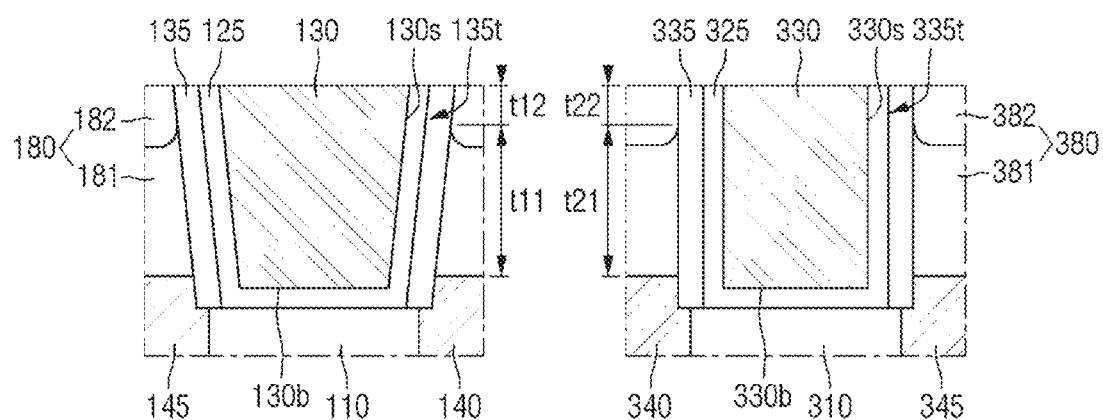
FIG. 6 is a view provided to explain a semiconductor device according to some example embodiments.
Figure 7:
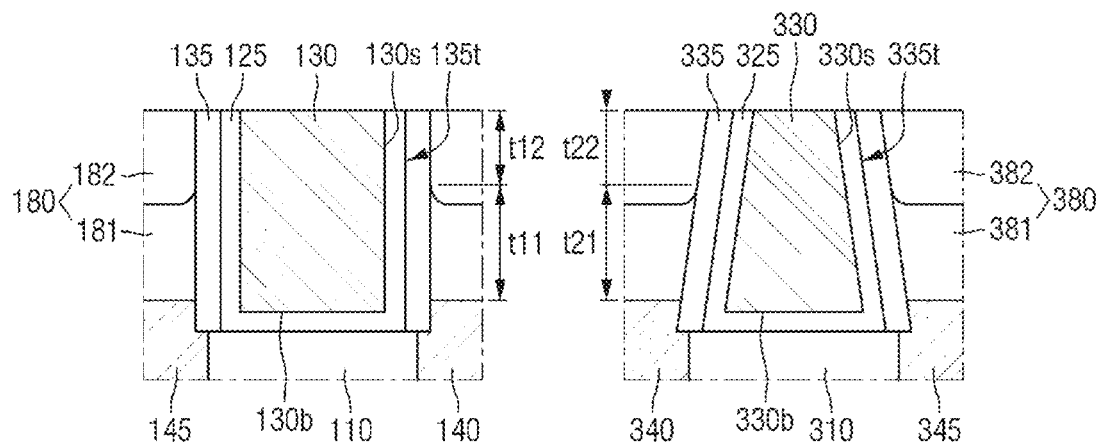
FIG. 7 is a view provided to explain a semiconductor device according to some example embodiments.

FIG. 6 is a view provided to explain a semiconductor device according to some example embodiments. FIG. 7 is a view provided to explain a semiconductor device according to some example embodiments. For convenience of explanation, differences that are not explained above with reference to FIGS. 1 to 5B will be mainly explained below.

For reference, FIGS. 6 and 7 are views illustrating the first gate structure portion and the third gate structure portion of FIG. 2 in enlargement.

Referring to FIGS. 6 and 7, in a semiconductor device according to some example embodiments, the thickness t12 of the first upper interlayer insulating film 182 and the thickness t22 of the second upper interlayer insulating film 382 may be substantially equal.

That is, the ratio of the thickness t12 of the first upper interlayer insulating film 182 to the thickness (t11+t12) of the first interlayer insulating film 180, and the ratio of the thickness t22 of the second upper interlayer insulating film 382 to the thickness (t21+t22) of the second interlayer insulating film 380 may be substantially equal.

In this case, the first distance L1 between the first gate structure 120 and the second gate structure 220 may be lower than the second distance L2 between the third gate structure 320 and the fourth gate structure 420.

Accordingly, the volume of the second upper interlayer insulating film 382 becomes greater than the volume of the first upper interlayer insulating film 182.

Because the first upper interlayer insulating film 182 and the second upper interlayer insulating film 382 may each have the compressive stress characteristic, the compressive stress of the second upper interlayer insulating film 382 becomes greater than the compressive stress of the first upper interlayer insulating film 182.

First, in a semiconductor device according to some example embodiments, when the sidewall of the gate electrode makes a right angle with respect to the bottom surface of the gate electrode, it is defined herein that the sign of the slope of the gate sidewall is different from a positive sign as well as a negative sign.

As illustrated in FIG. 6, the width of the first gate electrode 130 may increase as the distance from the bottom surface 130b of the first gate electrode increases.

Because the sidewall 130s of the first gate electrode may make an obtuse angle with respect to the bottom surface 130b of the first gate electrode, the sidewall 130s of the first gate electrode may have a positive slope.

In contrast, the width of the third gate electrode 330 may be constant as the distance from the bottom surface 330b of the third gate electrode increases. The sidewall 330s of the third gate electrode may make a right angle with respect to the bottom surface 330b of the third gate electrode.

Accordingly, the sign of the slope of the sidewall 130s of the first gate electrode and the sign of the slope of the sidewall 330s of the third gate electrode may be different from each other.

As illustrated in FIG. 7, the width of the first gate electrode 130 may be constant as the distance from the bottom surface 130b of the first gate electrode increases. The sidewall 130s of the first gate electrode may make a right angle with respect to the bottom surface 130b of the first gate electrode.

In contrast, the width of the third gate electrode 330 may decrease as the distance from the bottom surface 330b of the third gate electrode increases. Because the sidewall 330s of the third gate electrode may make an acute angle with respect to the bottom surface 330b of the third gate electrode, the sidewall 330s of the third gate electrode may have a negative slope.

Accordingly, the sign of the slope of the sidewall 130s of the first gate electrode and the sign of the slope of the sidewall 330s of the third gate electrode may be different from each other.

If the first upper interlayer insulating film 182 and the second upper interlayer insulating film 382 have tensile stress, the sign of the slope of the sidewall 130s of the first gate electrode of FIG. 6 may be a negative sign, and the sign of the slope of the sidewall 330s of the third gate electrode of FIG. 7 may be a positive sign.

Figure 8:
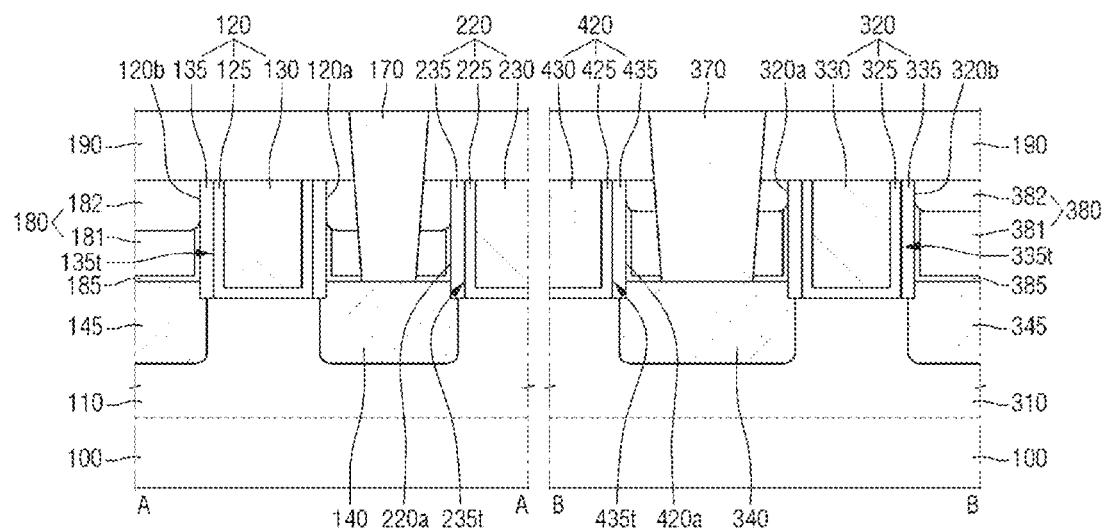
FIG. 8 is a view provided to explain a semiconductor device according to some example embodiments.
Figure 9:
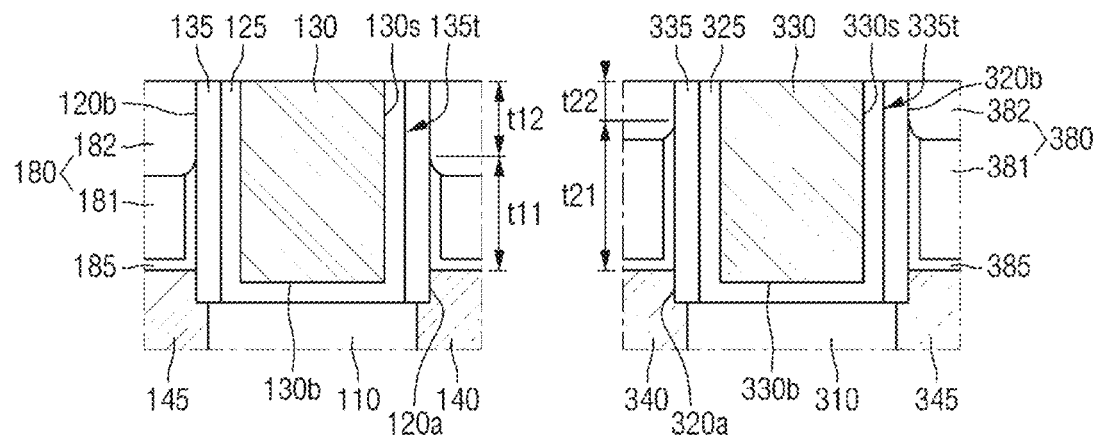
FIG. 9 illustrates the first gate structure portion and the third gate structure portion of FIG. 8 in enlargement.

FIG. 8 is a view provided to explain a semiconductor device according to some example embodiments. FIG. 9 illustrates the first gate structure portion and the third gate structure portion of FIG. 8 in enlargement.

For convenience of explanation, differences that are not explained above with reference to FIGS. 1 to 5B will be mainly explained below.

Referring to FIGS. 8 and 9, the semiconductor device according to some example embodiments may further include a first liner 185 and a second liner 385.

The first liner 185 may be formed between the first interlayer insulating film 180 and the sidewalls 120a, 120b of the first gate structure, between the first interlayer insulating film 180 and the sidewall 220a of the second gate structure, and between the first interlayer insulating film 180 and the substrate 100.

The first liner 185 may be formed along the sidewalls 120a, 120b of the first gate structure, the upper surface of the substrate 100, and the sidewall 220a of the second gate structure. However, the first liner 185 is not formed on the upper surface of the first gate structure 120 and the upper surface of the second gate structure 220.

More specifically, the first liner 185 may extend along a portion of the first sidewall 120a of the first gate structure, the upper surface of the substrate 100, and a portion of the sidewall 220a of the second gate structure, and may extend along a portion of the second sidewall 120b of the first gate structure.

The first liner 185 extending along the upper surface of the substrate 100 may extend along the upper surface of the first source/drain 140 and the upper surface of the second source/drain 145.

Because the first liner 185 extends along a portion of the sidewalls 120a, 120b of the first gate structure, the height of the uppermost portion of the first liner 185 formed on the sidewalls 120a, 120b of the first gate structure may be lower than the upper surface of the first gate structure 120.

Further, because the first liner 185 extends along a portion of the sidewall 220a of the second gate structure, the height of the uppermost portion of the first liner 185 formed on the sidewall 220a of the second gate structure may be lower than the upper surface of the second gate structure 220.

In other words, the height from the upper surface of the substrate 100 to the uppermost portion of the first liner 185 formed on the sidewalls 120a, 120b of the first gate structure may be lower than the height from the upper surface of the substrate 100 to the upper surface of the first gate structure 120.

For example, the first liner 185 may include one of silicon nitride, silicon oxynitride, silicon oxycarbonitride (SiOCN), silicon oxide, and a combination of silicon nitride, silicon oxynitride, silicon oxycarbonitride (SiOCN), and silicon oxide. Further, the first liner 185 may be a single film or multiple films.

The first interlayer insulating film 180 may be formed on the first liner 185. The first interlayer insulating film 180 may surround the sidewalls 120a, 120b of the first gate structure and the sidewall 220a of the second gate structure where the first liner 185 is formed.

The first lower interlayer insulating film 181 and the first upper interlayer insulating film 182 may be deposited in a sequential order on the first liner 185.

After dry etching to form the first liner 185 and the first lower interlayer insulating film 181, the first upper interlayer insulating film 182 may be formed on the first lower interlayer insulating film 181. Accordingly, the first liner 185 may not extend between the first upper interlayer insulating film 182 and the sidewalls 120a, 120b of the first gate structure, but not limited thereto.

Additionally, the first upper interlayer insulating film 182 may cover the upper surface of the first liner 185 that is formed on the sidewalls 120a, 120b of the first gate structure and the sidewall 220a of the second gate structure.

The thickness t12 of the first upper interlayer insulating film 182 formed on the first lower interlayer insulating film 181 may correspond to a distance from the upper surface of the first gate structure 120 to the uppermost portion of the first liner 185.

The first contact 170 may be passed through the first liner 185 formed on the upper surface of the first source/drain 140 and connected with the first source/drain 140.

The second liner 385 may be formed between the second interlayer insulating film 380 and the sidewalls 320a, 320b of the third gate structure, between the second interlayer insulating film 380 and the sidewall 420a of the fourth gate structure, and between the second interlayer insulating film 380 and the substrate 100.

The second liner 385 may be formed along the sidewalls 320a, 320b of the third gate structure, the upper surface of the substrate 100, and the sidewall 420a of the fourth gate structure. However, the second liner 385 is not formed on the upper surface of the third gate structure 320 and the upper surface of the fourth gate structure 420.

More specifically, the second liner 385 may extend along a portion of the first sidewall 320a of the third gate structure, the upper surface of the substrate 100, and a portion of the sidewall 420a of the fourth gate structure, and may extend along a portion of the second sidewall 320b of the third gate structure.

The second liner 385 extending along the upper surface of the substrate 100 may extend along the upper surface of the third source/drain 340 and the upper surface of the fourth source/drain 345.

Since the second liner 385 extends along a portion of the sidewalls 320a, 320b of the third gate structure, the height of the uppermost portion of the second liner 385 formed on the sidewalls 320a, 320b of the third gate structure may be lower than the upper surface of the third gate structure 320.

Further, because the second liner 385 extends along a portion of the sidewall 420a of the fourth gate structure, the height of the uppermost portion of the second liner 385 formed on the sidewall 420a of the fourth gate structure may be lower than the upper surface of the fourth gate structure 420.

In other words, the height from the upper surface of the substrate 100 to the uppermost portion of the second liner 385 formed on the sidewalls 320a, 320b of the third gate structure may be lower than the height from the upper surface of the substrate 100 to the upper surface of the third gate structure 320.

The second interlayer insulating film 380 may be formed on the second liner 385. The second interlayer insulating film 380 may surround the sidewalls 320a, 320b of the third gate structure and the sidewall 420a of the fourth gate structure where the second liner 385 is formed.

The second lower interlayer insulating film 381 and the second upper interlayer insulating film 382 may be deposited in a sequential order on the second liner 385.

After dry etching to form the second liner 385 and the second lower interlayer insulating film 381, the second upper interlayer insulating film 382 may be formed on the second lower interlayer insulating film 381.

The second upper interlayer insulating film 382 may cover the upper surface of the second liner 385 that is formed on the sidewalls 320a, 320b of the third gate structure and the sidewall 420a of the fourth gate structure.

The thickness t22 of the second upper interlayer insulating film 382 formed on the second lower interlayer insulating film 381 may correspond to a distance from the upper surface of the third gate structure 320 to the uppermost portion of the second liner 385.

The second contact 370 may be passed through the second liner 385 formed on the upper surface of the third source/drain 340 and connected with the third source/drain 340.

As illustrated in FIG. 9, the slope of the sidewall 130s of the first gate electrode and the slope of the sidewall 330s of the third gate electrode may have the same sign. For example, the sidewall 130s of the first gate electrode and the sidewall 330s of the third gate electrode may be orthogonal to the upper surface of the substrate 100.

The first distance L1 between the first gate structure 120 and the second gate structure 220 may be lower than the second distance L2 between the third gate structure 320 and the fourth gate structure 420.

In order to adjust the magnitude of the compressive stress applied by the first upper interlayer insulating film 182 to the first gate structure 120 and the magnitude of the compressive stress applied by the second upper interlayer insulating film 382 to the third gate structure 320, the distance t12 from the upper surface of the first gate structure 120 to the uppermost portion of the first liner 185 may be greater than the distance t22 from the upper surface of the third gate structure 320 to the uppermost portion of the second liner 385.

Figure 10:
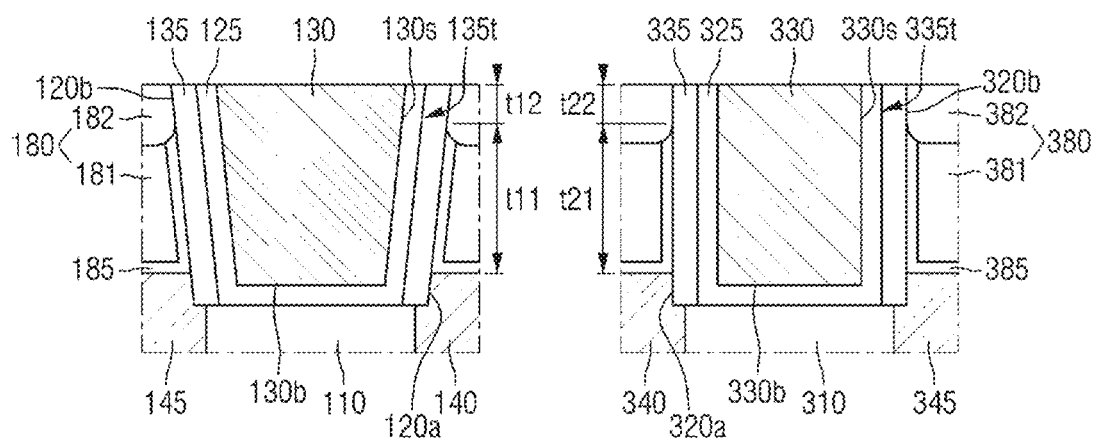
FIG. 10 is a view provided to explain a semiconductor device according to some example embodiments.
Figure 11:
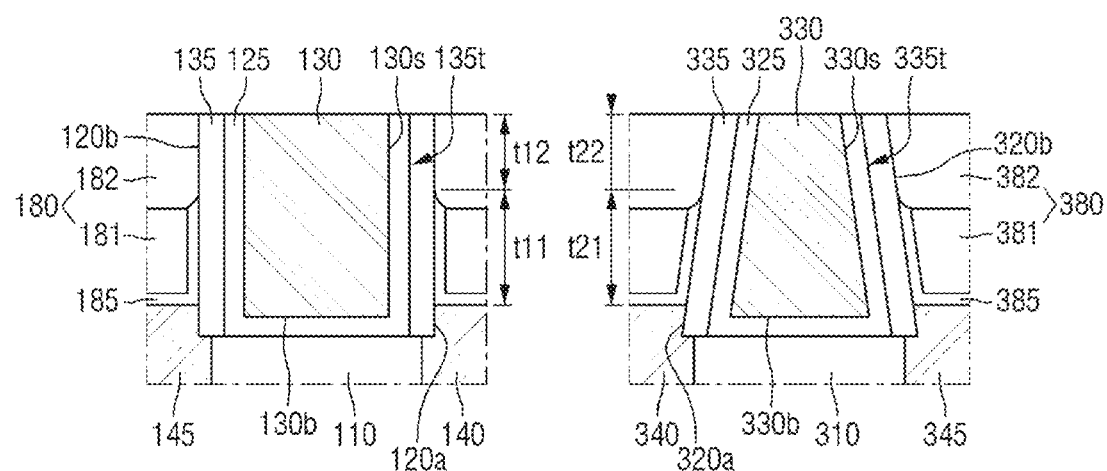
FIG. 11 is a view provided to explain a semiconductor device according to some example embodiments.

FIG. 10 is a view provided to explain a semiconductor device according to some example embodiments. FIG. 11 is a view provided to explain a semiconductor device according to some example embodiments. For convenience of explanation, differences that are not explained above with reference to FIGS. 8 and 9 will be mainly explained below.

For reference, FIGS. 10 and 11 are views illustrating the first gate structure portion and the third gate structure portion of FIG. 8 in enlargement.

Referring to FIGS. 10 and 11, in a semiconductor device according to some example embodiments, the thickness t12 of the first upper interlayer insulating film 182 and the thickness t22 of the second upper interlayer insulating film 382 may be substantially equal.

The distance t12 from the upper surface of the first gate structure 120 to the uppermost portion of the first liner 185 and the distance t12 from the upper surface of the third gate structure 320 to the uppermost portion of the second liner 385 may be substantially equal.

Because the first distance L1 between the first gate structure 120 and the second gate structure 220 is lower than the second distance L2 between the third gate structure 320 and the fourth gate structure 420, the volume of the second upper interlayer insulating film 382 becomes greater than the volume of the first upper interlayer insulating film 182.

Because the compressive stress of the second upper interlayer insulating film 382 becomes greater than the compressive stress of the first upper interlayer insulating film 182, the sign of the slope of the sidewall 130s of the first gate electrode and the sign of the slope of the sidewall 330s of the third gate electrode may be different from each other.

As illustrated in FIG. 10, the sidewall 130s of the first gate electrode may make a positive slope and the sidewall 330s of the third gate electrode may make a right angle.

As illustrated in FIG. 11, the sidewall 130s of the first gate electrode may have a slope at a right angle, and the sidewall 330s of the third gate electrode may have a negative slope.

Figure 12:
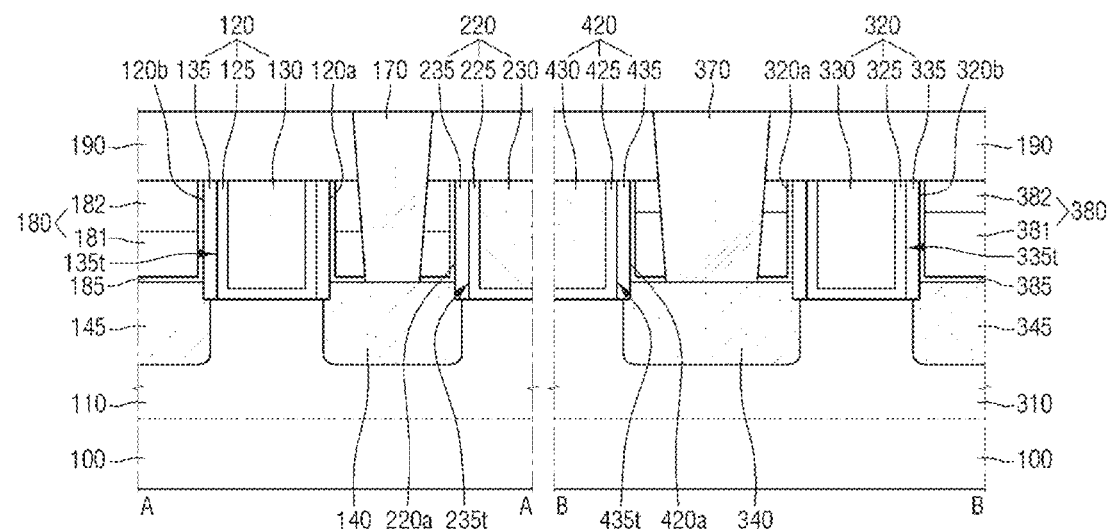
FIG. 12 is a view provided to explain a semiconductor device according to some example embodiments.

FIG. 12 is a view provided to explain a semiconductor device according to some example embodiments. FIG. 13 is a view provided to explain a semiconductor device according to some example embodiments. FIG. 14 is a view provided to explain a semiconductor device according to some example embodiments. For convenience of explanation, differences that are not explained above with reference to FIGS. 8 and 9 will be mainly explained below.

Referring to FIG. 12, in a semiconductor device according to some example embodiments, the first liner 185 may be formed along the entirety of the sidewalls 120a, 120b of the first gate structure and the sidewall 220a of the second gate structure.

Further, the second liner 385 may be formed along the entirety of the sidewalls 320a, 320b of the third gate structure and the sidewall 420a of the fourth gate structure.

In other words, the height from the upper surface of the substrate 100 to the uppermost portion of the first liner 185 may be substantially equal to the height from the upper surface of the substrate 100 to the upper surface of the first gate structure 120.

Further, the height from the upper surface of the substrate 100 to the uppermost portion of the second liner 385 may be substantially equal to the height from the upper surface of the substrate 100 to the upper surface of the third gate structure 320.

While FIG. 12 illustrates boundary surfaces between the first lower interlayer insulating film 181 and the first upper interlayer insulating film 182, and between the second lower interlayer insulating film 381 and the second upper interlayer insulating film 382 as the planes, example embodiments are not limited thereto.

Figure 13:
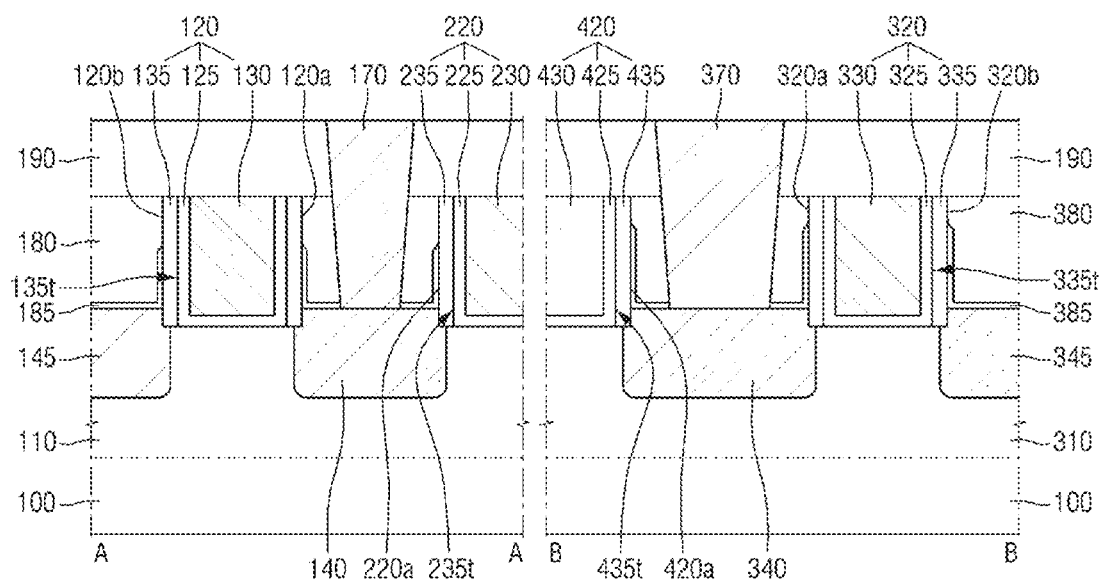
FIG. 13 is a view provided to explain a semiconductor device according to some example embodiments.
Figure 14:
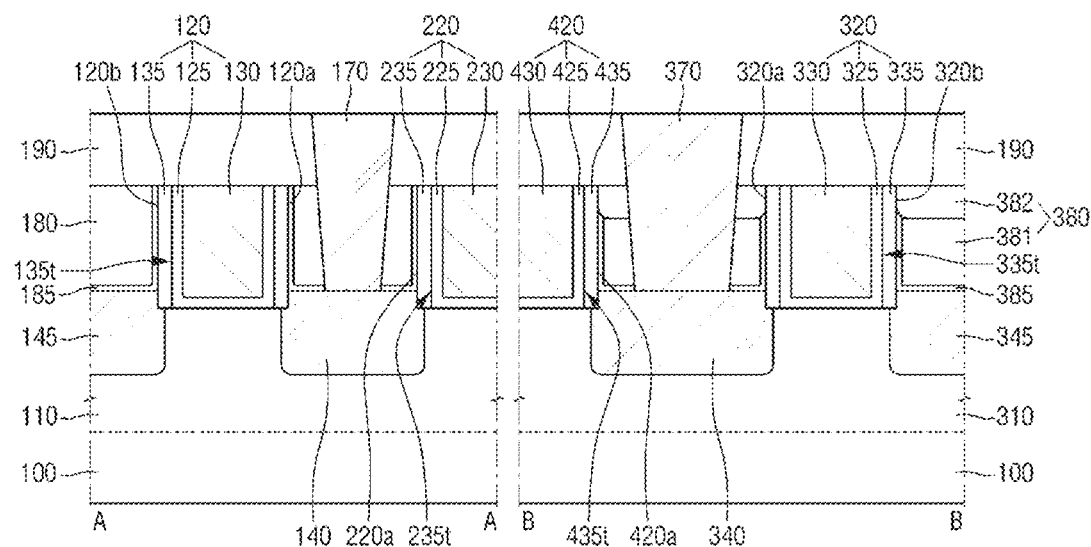
FIG. 14 is a view provided to explain a semiconductor device according to some example embodiments.

Referring to FIG. 13, in a semiconductor device according to some example embodiments, the first interlayer insulating film 180 formed on the first liner 185 may be a single film. Further, the second interlayer insulating film 380 formed on the second liner 385 may be a single film.

By the statement that the first interlayer insulating film 180 and the second interlayer insulating film 380 are 'single film', it simply means that each, or at least one of the first interlayer insulating film 180 and the second interlayer insulating film 380 is formed of or include a single material.

Accordingly, while each, or at least one of the first interlayer insulating film 180 and the second interlayer insulating film 380 may be formed of or include a single material, each, or at least one, of the first interlayer insulating film 180 and the second interlayer insulating film 380 may include a material of different stress characteristic from the other. This is because, as described above, even the same material can have different stress characteristic under different forming conditions including heat treatment condition, and so on.

Even when the first interlayer insulating film 180 is a single film, the height from the upper surface of the substrate 100 to the uppermost portion of the first liner 185 formed on the sidewalls 120a, 120b of the first gate structure may be lower than the height from the upper surface of the substrate 100 to the upper surface of the first gate structure 120.

Further, even when the second interlayer insulating film 380 is a single film, the height from the upper surface of the substrate 100 to the uppermost portion of the second liner 385 formed on the sidewalls 320a, 320b of the third gate structure may be lower than the height from the upper surface of the substrate 100 to the upper surface of the third gate structure 320.

Further, the height from the upper surface of the substrate 100 to the uppermost portion of the first liner 185 formed on the sidewalls 120a, 120b of the first gate structure may be different from the height from the upper surface of the substrate 100 to the uppermost portion of the second liner 385 formed on the sidewalls 320a, 320b of the third gate structure.

Referring to FIG. 14, in a semiconductor device according to some example embodiments, the first interlayer insulating film 180 formed on the first liner 185 may be a single film. Further, the first liner 185 may be formed along the entirety of the sidewalls 120a, 120b of the first gate structure and the sidewall 220a of the second gate structure.

The height from the upper surface of the substrate 100 to the uppermost portion of the first liner 185 may be substantially equal to the height from the upper surface of the substrate 100 to the upper surface of the first gate structure 120.

For example, the first interlayer insulating film 180 may include a same material as the second lower interlayer insulating film 381 and have the same stress characteristic.

In contrast, the second interlayer insulating film 380 on the second liner 385 may include the second lower interlayer insulating film 381 and the second upper interlayer insulating film 382.

The height from the upper surface of the substrate 100 to the uppermost portion of the second liner 385 formed on the sidewalls 320a, 320b of the third gate structure may be lower than the height from the upper surface of the substrate 100 to the upper surface of the third gate structure 320.

Figure 15A:
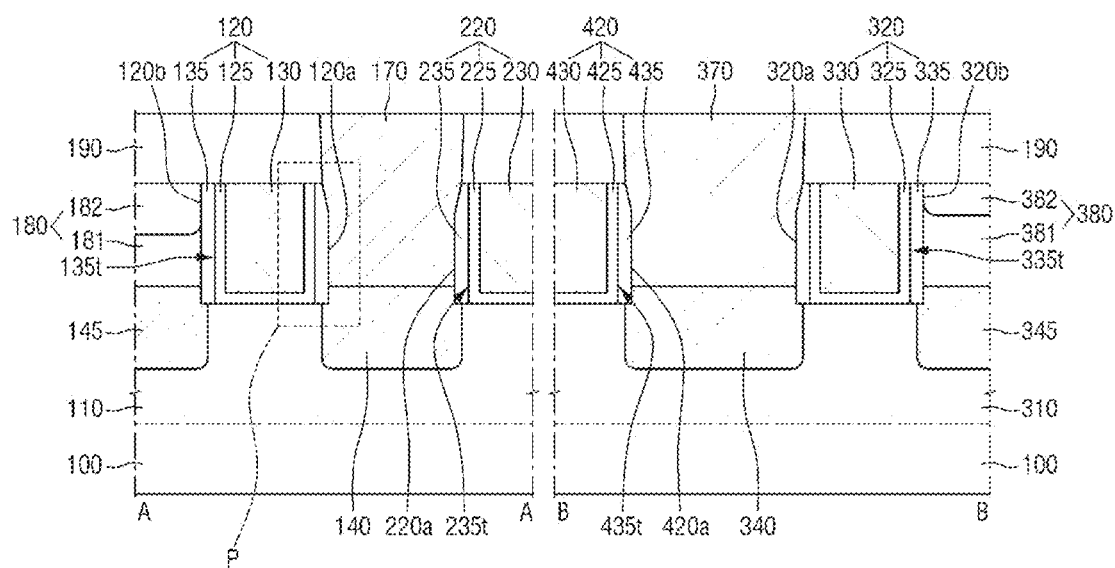
FIG. 15A is a view provided to explain a semiconductor device according to some example embodiments.
Figure 15B:
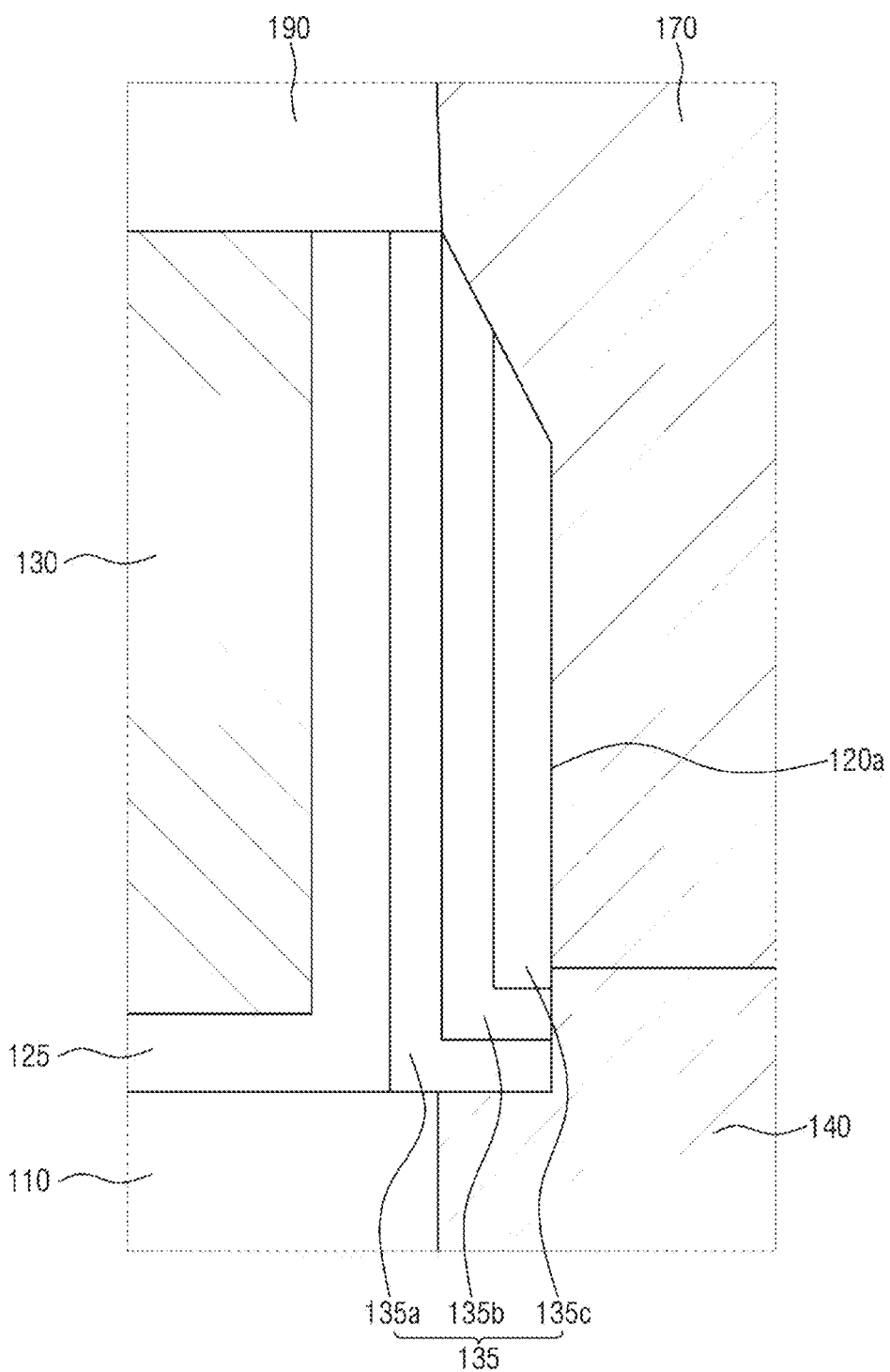
FIG. 15B is an enlarged, example view of the squared area P of FIG. 15A.

FIG. 15A is a view provided to explain a semiconductor device according to some example embodiments. FIG. 15B is an enlarged, example view of the squared area P of FIG. 15A. For convenience of explanation, differences that are not explained above with reference to FIGS. 1 to 5B will be mainly explained below.

For reference, FIG. 15B may be a view exemplifying an example in which the gate spacer is a multi-film. That is, when the gate spacer is a single film, it may be in an I-shape as illustrated in FIG. 15A.

Referring to FIGS. 15A and 15B, in a semiconductor device according to some example embodiments, the first contact 170 may contact the first gate structure 120 and the second gate structure 220.

The first contact 170 may be aligned by the first sidewall 120a of the first gate structure and the sidewall 220a of the second gate structure. The first contact 170 may be connected with the first source/drain 140.

However, a contact that contacts the second sidewall 120b of the first gate structure and is connected with the second source/drain 145 may not be formed.

The second contact 370 may contact the third gate structure 320 and the fourth gate structure 420.

The second contact 370 may be aligned by the first sidewall 320a of the third gate structure and the sidewall 420a of the fourth gate structure. The second contact 370 may be connected with the third source/drain 340.

However, a contact that contacts the second sidewall 320b of the third gate structure and is connected with the fourth source/drain 345 may not be formed.

For example, the width of the first contact 170 and the width of the second contact 370 may increase as the distance from the upper surface of the substrate 100 increases.

As illustrated in FIG. 15B, the first gate spacer 135 may be a triple film that includes a first portion 135a, a second portion 135b and a third portion 135c, although example embodiments are not limited thereto.

For example, when the first gate spacer 135 is formed as a triple layer, at least one of the first to third portions 135a, 135b, 135c of the first gate spacer 135 may have an L-shape.

As illustrated in FIG. 15B, the first portion 135a of the first gate spacer and the second portion 135b of the first gate spacer may each have an L-shape. However, this is provided only for convenience of explanation, and example embodiments are not limited thereto.

That is, it is of course possible that one of the first portion 135a of the first gate spacer and the second portion 135b of the first gate spacer may have an L-shape.

Further, at least one of the first portion 135a of the first gate spacer, the second portion 135b of the first gate spacer, or the third portion 135c of the first gate spacer may include a low-k material such as silicon oxycarbon nitride (SiOCN) layer.

Figure 16:
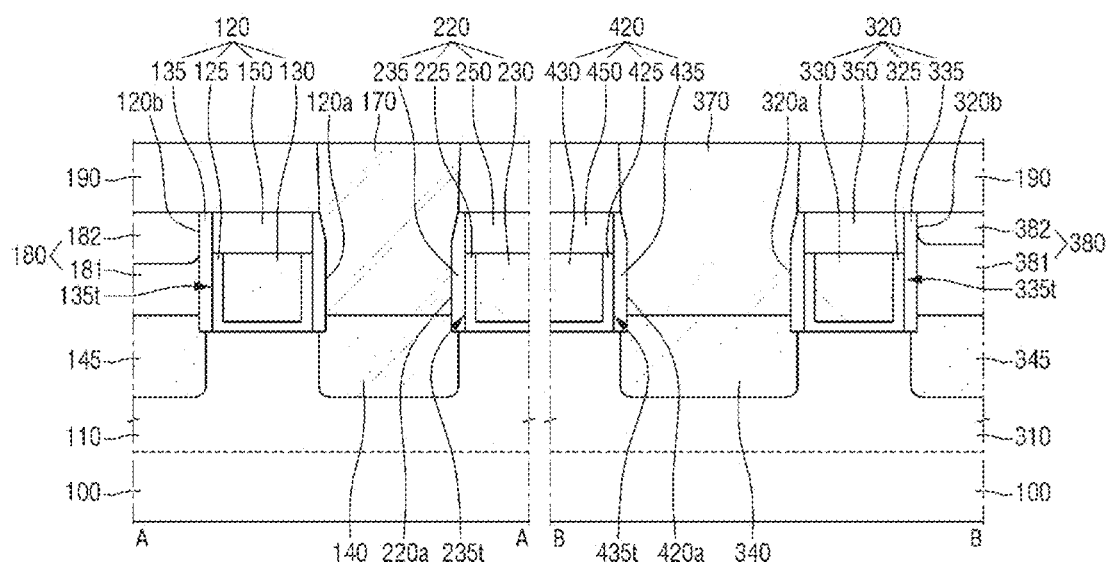
FIG. 16 is a view provided to explain a semiconductor device according to some example embodiments.

FIG. 16 is a view provided to explain a semiconductor device according to some example embodiments. For convenience of explanation, differences that are not explained above with reference to FIG. 15A will be mainly explained below.

Referring to FIG. 16, in a semiconductor device according to some example embodiments, the first gate structure 120 may include a first capping pattern 150, and the second gate structure 220 may include a second capping pattern 250.

Further, the third gate structure 320 may include a third capping pattern 350, and the fourth gate structure 420 may include a fourth capping pattern 450.

For example, the first gate electrode 130 may fill a portion of the first trench 135t. The first capping pattern 150 may be formed on the first gate electrode 130. The first capping pattern 150 may fill rest of the first trench 135t left after the first gate electrode 130 is formed.

While FIG. 16 illustrates that the first gate insulating film 125 is not formed between the first gate spacer 135 and the first capping pattern 150, this is provided only for convenience of explanation and example embodiments are not limited thereto.

The upper surface of the first capping pattern 150 may be the upper surface of the first gate structure 120. The upper surface of the first capping pattern 150 may be in the same plane as the upper surface of the first interlayer insulating film 180.

The first capping pattern 150 may include, for example, a material having etch selectivity with respect to the first interlayer insulating film 180.

The first capping pattern 150 may include at least one of, for example, silicon nitride (SiN), silicon oxynitride (SiON), silicon dioxide (SiO$_2$), silicon carbon nitride (SiCN), silicon oxycarbon nitride (SiOCN), and a combination of silicon nitride (SiN), silicon oxynitride (SiON), silicon dioxide (SiO$_2$), silicon carbon nitride (SiCN) and silicon oxycarbon nitride (SiOCN).

Description about the second capping pattern 250, the third capping pattern 350, and the fourth capping pattern 450 will be omitted, as this is similar to or the same as that of the first capping pattern 150.

Figure 17:
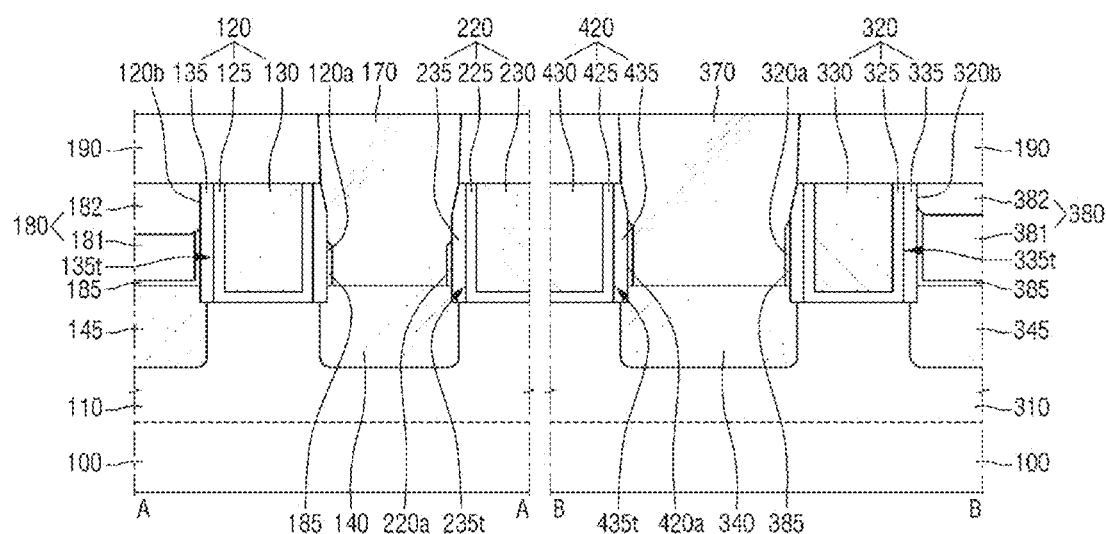
FIG. 17 is a view provided to explain a semiconductor device according to some example embodiments.
Figure 18:
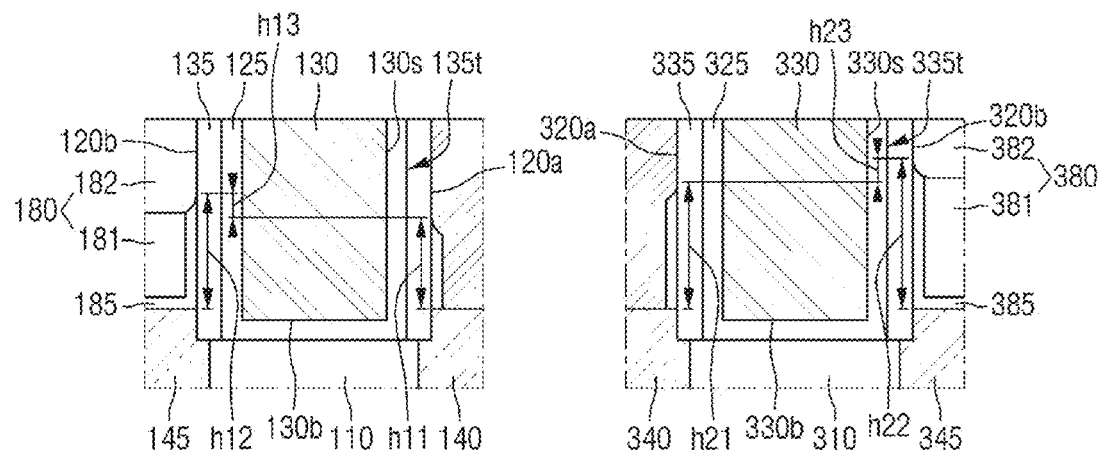
FIG. 18 illustrates the first gate structure portion and the third gate structure portion of FIG. 17 in enlargement.

FIG. 17 is a view provided to explain a semiconductor device according to some example embodiments. FIG. 18 illustrates the first gate structure portion and the third gate structure portion of FIG. 17 in enlargement. For convenience of explanation, differences that are not explained above with reference to FIGS. 8 and 9 will be mainly explained below.

Referring to FIGS. 17 and 18, the first contact 170 may contact the first gate structure 120 and the second gate structure 220.

The first contact 170 may be aligned by the first sidewall 120a of the first gate structure and the sidewall 220a of the second gate structure. The first contact 170 may be connected with the first source/drain 140.

However, a contact that contacts the second sidewall 120b of the first gate structure and is connected with the second source/drain 145 may not be formed.

Further, the first liner 185 may be positioned between the first contact 170 and the first sidewall 120a of the first gate structure.

The first liner 185 extending along the upper surface of the first source/drain 140 may be removed during process of forming the first contact 170, but the first liner 185 on a portion of the first sidewall 120a of the first gate structure may not be removed but remain.

During process of forming the first contact 170, a portion of the first liner 185 on the first sidewall 120a of the first gate structure may be removed.

However, because a contact that contacts the second sidewall 120b of the first gate structure is not formed, the first liner 185 on the portion of the second sidewall 120b of the first gate structure may not be removed.

Accordingly, the height h11 of the first liner 185 on the first sidewall 120a of the first gate structure may be different from the height h12 of the first liner 185 on the second sidewall 120b of the first gate structure.

For example, the height h12 of the first liner 185 on the second sidewall 120b of the first gate structure may be greater than the height h11 of the first liner 185 on the first sidewall 120a of the first gate structure by a first height h13.

The second contact 370 may contact the third gate structure 320 and the fourth gate structure 420.

The second contact 370 may be aligned by the first sidewall 320a of the third gate structure and the sidewall 420a of the fourth gate structure. The second contact 370 may be connected with the third source/drain 340.

However, a contact that contacts the second sidewall 320b of the third gate structure and is connected with the fourth source/drain 345 may not be formed.

The second liner 385 may be positioned between the second contact 370 and the first sidewall 320a of the third gate structure.

The second liner 385 extending along the upper surface of the third source/drain 340 may be removed during process of forming the second contact 370, but the second liner 385 on a portion of the first sidewall 320a of the third gate structure may not be removed but remain.

During process of forming the second contact 370, a portion of the second liner 385 on the first sidewall 320a of the third gate structure may be removed.

However, because a contact that contacts the second sidewall 320b of the third gate structure is not formed, the second liner 385 on the portion of the second sidewall 320b of the third gate structure may not be removed.

Accordingly, the height h21 of the second liner 385 on the first sidewall 320a of the third gate structure may be different from the height h22 of the second liner 385 on the second sidewall 320b of the third gate structure.

For example, the height h22 of the second liner 385 on the second sidewall 320b of the third gate structure may be greater than the height h21 of the second liner 385 on the first sidewall 320a of the third gate structure by a second height h23.

For example, the width of the first contact 170 and the width of the second contact 370 may increase as the distance from the upper surface of the substrate 100 increases.

Figure 19:
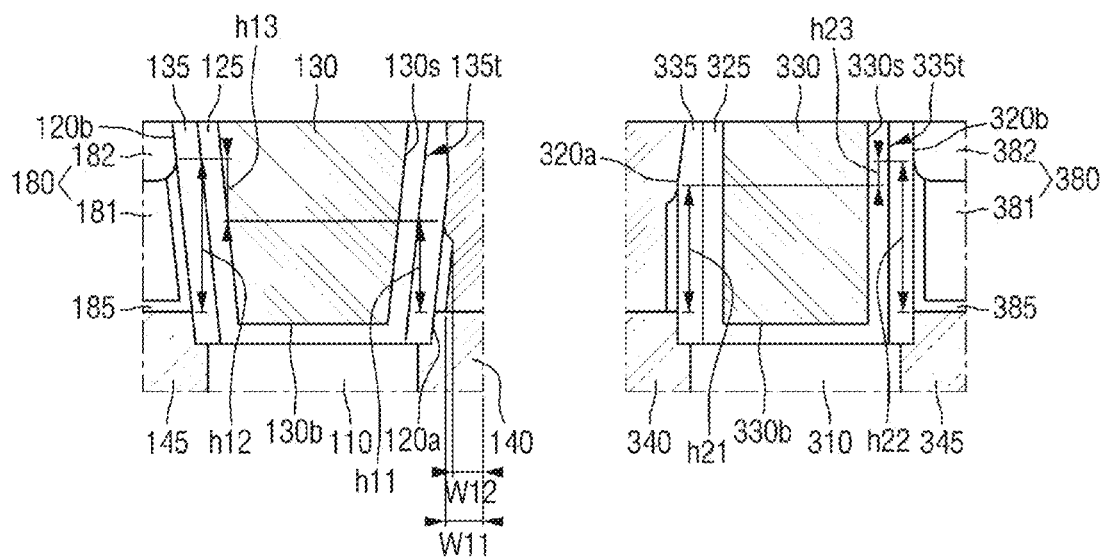
FIG. 19 is a view provided to explain a semiconductor device according to some example embodiments.
Figure 20:
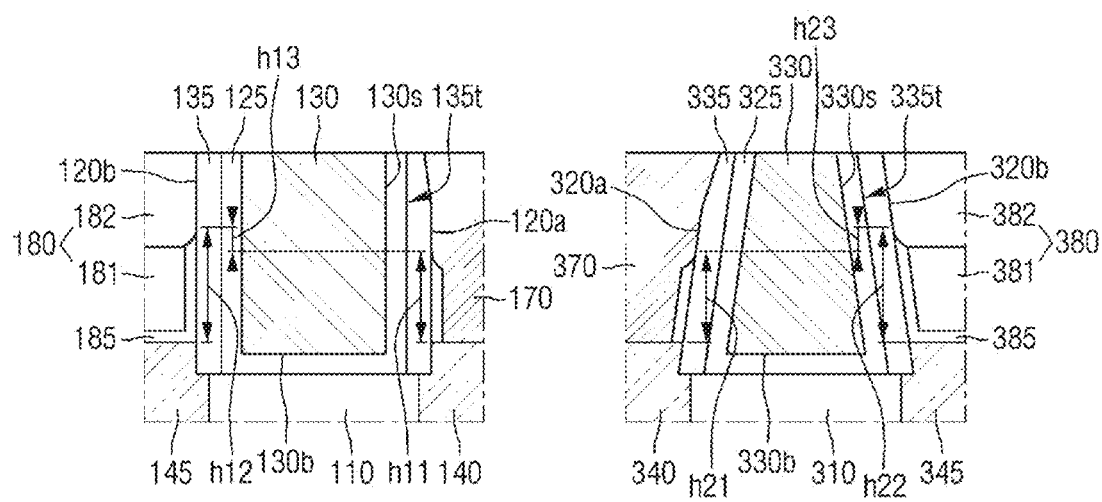
FIG. 20 is a view provided to explain a semiconductor device according to some example embodiments.
Figure 21:
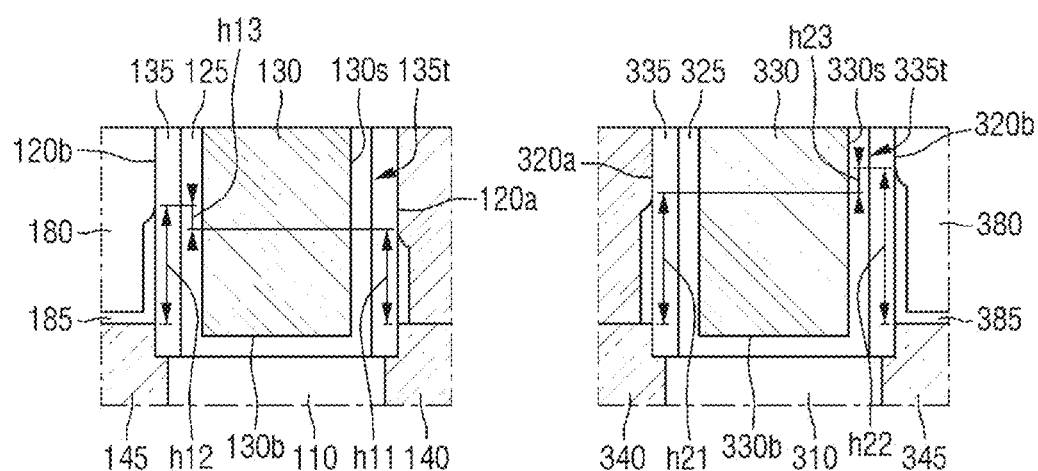
FIG. 21 is a view provided to explain a semiconductor device according to some example embodiments.

FIG. 19 is a view provided to explain a semiconductor device according to some example embodiments. FIG. 20 is a view provided to explain a semiconductor device according to some example embodiments. FIG. 21 is a view provided to explain a semiconductor device according to some example embodiments.

For convenience of explanation, differences that are not explained above with reference to FIGS. 17 and 18 will be mainly explained below.

For reference, FIGS. 19 to 21 are views illustrating the first gate structure portion and the third gate structure portion of FIG. 17 in enlargement.

Referring to FIG. 19, in a semiconductor device according to some example embodiments, the sidewall 130s of the first gate electrode may have a positive slope, and the sidewall 330s of the third gate electrode may have a slope at a right angle.

The width of the first gate electrode 130 may increase as the distance from the upper surface of the first fin-type pattern 110 increases. Further, the width of the third gate electrode 330 may be substantially constant as the distance from the upper surface of the second fin-type pattern 310 increases.

When the sidewall 130s of the first gate electrode has a positive slope, the sidewall of the first contact 170 contacting the first sidewall 120a of the first gate structure may have a negative slope.

That is, the width of the first contact 170 decreases from W11 to W12, along a direction from the upper surface of the first source/drain 140 toward the uppermost portion of the first liner 185 on the first sidewall 120a of the first gate structure. After that, the width of the first contact 170 may increase along the direction from the uppermost portion of the first liner 185 toward the upper surface of the first gate structure 120.

In other words, the width of the first contact 170 may decrease and then increase, as the distance from the upper surface of the first fin-type pattern 110, i.e., as the distance from the upper surface of the substrate 100 increases.

In contrast, the width of the second contact 370 may increase, as the distance from the upper surface of the second fin-type pattern 310, i.e., as the distance from the upper surface of the substrate 100 increases.

Referring to FIG. 20, in a semiconductor device according to some example embodiments, the sidewall 130s of the first gate electrode may have a slope at a right angle, and the sidewall 330s of the third gate electrode may have a negative slope.

The width of the third gate electrode 330 may decrease as the distance from the upper surface of the second fin-type pattern 310 increases. Further, the width of the first gate electrode 130 may be substantially constant as the distance from the upper surface of the first fin-type pattern 110 increases.

The width of the first contact 170 may increase as the distance from the upper surface of the first fin-type pattern 110, i.e., as the distance from the upper surface of the substrate 100 increases. The width of the second contact 370 may increase as the distance from the upper surface of the second fin-type pattern 310, i.e., as the distance from the upper surface of the substrate 100 increases.

Referring to FIG. 21, in a semiconductor device according to some example embodiments, the first interlayer insulating film 180 surrounding the second sidewall 120b of the first gate structure, and the second interlayer insulating film 380 surrounding the second sidewall 320b of the third gate structure may be single films.

While the first interlayer insulating film 180 and the second interlayer insulating film 380 may each be formed of or include a single material, each may include a material of different stress characteristic from the other.

Figure 22:
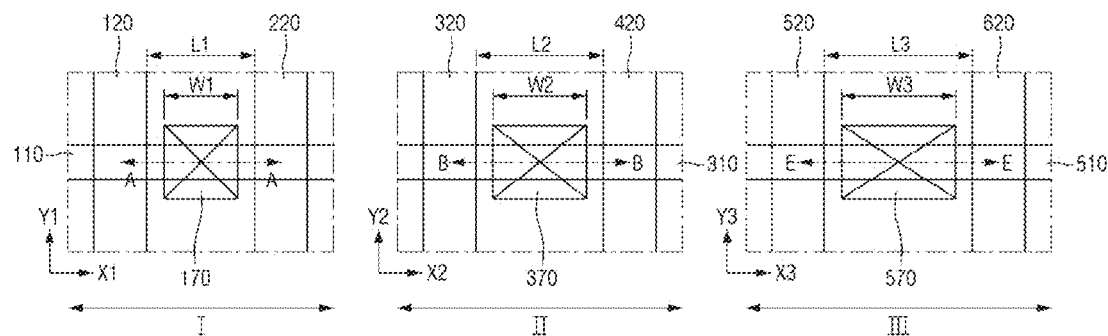
FIG. 22 is a layout diagram provided to explain a semiconductor device according to some example embodiments.
Figure 23:
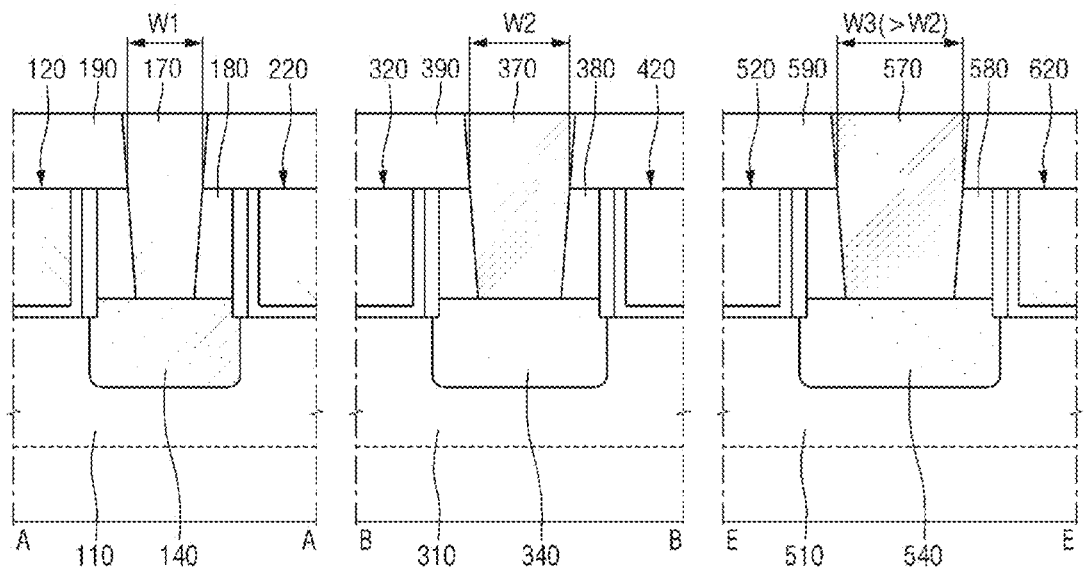
FIG. 23 is a cross sectional view taken on lines A-A, B-B, and E-E of FIG. 22.

FIG. 22 is layout diagrams provided to explain a semiconductor device according to some example embodiments. FIG. 23 is cross sectional views taken on lines A-A, B-B, and E-E of FIG. 22.

For convenience of explanation, differences that are not explained above with reference to FIGS. 1 to 5B will be mainly explained below.

Referring to FIGS. 22 and 23, a semiconductor device according to some example embodiments may additionally include a third fin-type pattern 510, a fifth gate structure 520, a sixth gate structure 620, and a third contact 570.

The substrate 100 may include a first region I, a second region II, and a third region III. The third region III, and the first region I and/or the second region II may be the regions that are spaced apart from one another, or connected with one another.

In the third region III, the third fin-type pattern 510, the fifth gate structure 520, the sixth gate structure 620, and the third contact 570 may be formed.

The third fin-type pattern 510 may extend longitudinally on the substrate 100 in a fifth direction X3. The third fin-type pattern 510 may protrude from the substrate 100.

The fifth gate structure 520 may extend in a sixth direction Y3. The fifth gate structure 520 may be formed to intersect the third fin-type pattern 510.

The sixth gate structure 620 may extend in the sixth direction Y3. The sixth gate structure 620 may be formed to intersect the third fin-type pattern 510. The sixth gate structure 620 may be spaced apart from the fifth gate structure 520 by a third distance L3.

The distance L3 of spacing between the fifth gate structure 520 and the sixth gate structure 620 may be greater than the distance L1 of spacing between the first gate structure 120 and the second gate structure 220, and the distance L2 of spacing between the third gate structure 320 and the fourth gate structure 420.

Further, the fifth gate structure 520 may include a fifth gate electrode, a fifth gate insulating film, and a fifth gate spacer, and the sixth gate structure 620 may include a sixth gate electrode, a sixth gate insulating film, and a sixth gate spacer.

Description of the structures of the fifth gate structure 520 and the sixth gate structure 620 may be substantially identical to that of the first gate structure 120, and therefore, will not be redundantly described below.

The fifth source/drain 540 may be formed between the fifth gate structure 520 and the sixth gate structure 620. As illustrated, the fifth source/drain 540 may include an epitaxial layer formed within the third fin-type pattern 510, although example embodiments are not limited thereto.

Depending on whether the semiconductor device formed in the third region III is a PMOS or an NMOS, the fifth source/drain 540 may include a tensile stress material, or a compressive stress material, or a material same as the third fin-type pattern 510.

The fourth interlayer insulating film 580 may be formed on the substrate 100 of the third region III. The fourth interlayer insulating film 580 may cover the third fin-type pattern 510, and the fifth source/drain 540.

The upper surface of the fourth interlayer insulating film 580 may be in the same plane as, for example, the upper surface of the fifth gate structure 520 and the upper surface of the sixth gate structure 620.

Description of the fourth interlayer insulating film 580 may be substantially identical to that of the first interlayer insulating film 180, and will not be redundantly described below.

The third contact 570 may be formed between the fifth gate structure 520 and the sixth gate structure 620.

The third contact 570 may be formed within the third interlayer insulating film 190 and the fourth interlayer insulating film 580. The third contact 570 may not contact the fifth gate structure 520 and the sixth gate structure 620. The third contact 570 may be connected with the fifth source/drain 540.

The third contact 570 may have a third width W3. For example, the third width W3 of the third contact 570 may be based on the upper surface of the fifth gate structure 520 and the upper surface of the sixth gate structure 620, but this is provided only for convenience of explanation and example embodiments are not limited thereto. That is, the third width W3 of the third contact 570 may be based on the upper surface of the third interlayer insulating film 590.

Further, the third width W3 of the third contact 570 may be a width in the fifth direction X3.

As illustrated in FIG. 23, the third width W3 of the third contact 570 may be greater than the first width W1 of the first contact 170 and the second width W2 of the second contact 370.

That is, the width of the contacts formed between the gate structures may increase as the distance between the gate structures increases.

Figure 24:
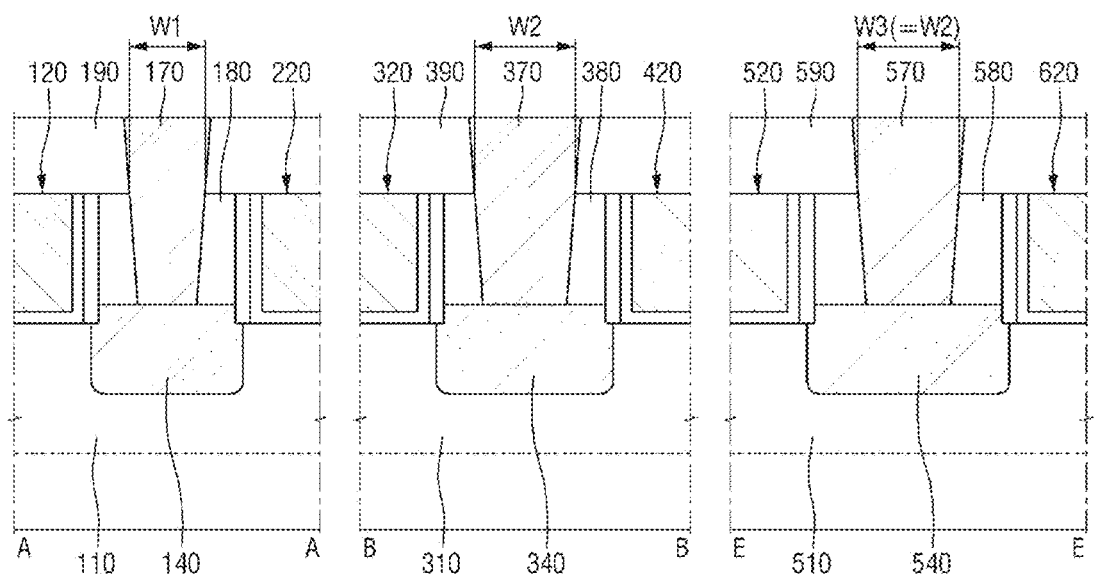
FIG. 24 is a view provided to explain a semiconductor device according to some example embodiments.

FIG. 24 is a view provided to explain a semiconductor device according to some example embodiments. For convenience of explanation, differences that are not explained above with reference to FIGS. 22 and 23 will be mainly explained below.

Referring to FIG. 24, in a semiconductor device according to some example embodiments, the third width W3 of the third contact 570 may be greater than the first width W1 of the first contact 170, but substantially equal to the second width W2 of the second contact 370.

The distance L3 of spacing between the fifth gate structure 520 and the sixth gate structure 620 may be greater than the distance L2 of spacing between the third gate structure 320 and the fourth gate structure 420, but the third width W3 of the third contact 570 may be substantially equal to the second width W2 of the second contact 370.

Figure 25:
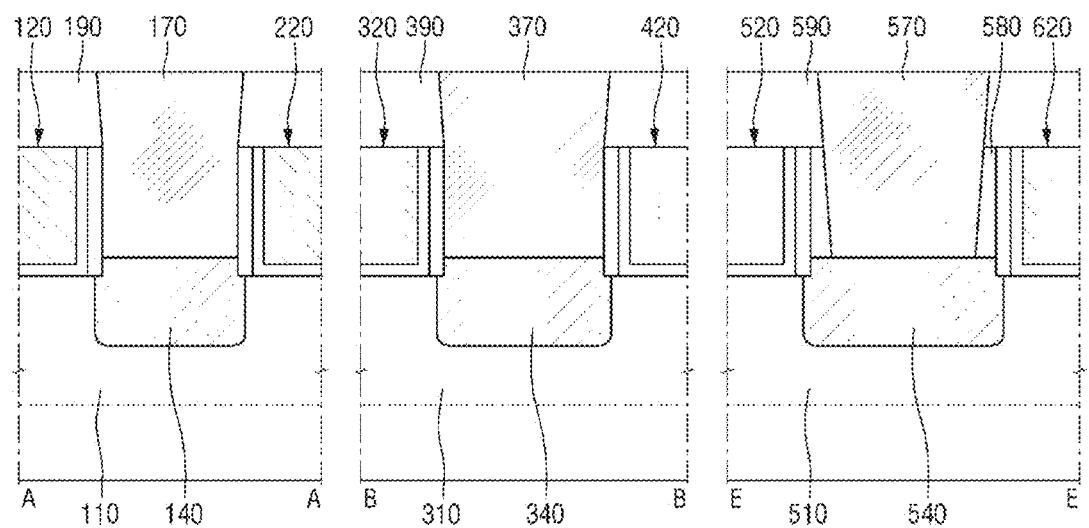
FIG. 25 is a view provided to explain a semiconductor device according to some example embodiments.

FIG. 25 is a view provided to explain a semiconductor device according to some example embodiments. For convenience of explanation, differences that are not explained above with reference to FIG. 24 will be mainly explained below.

Referring to FIG. 25, in a semiconductor device according to some example embodiments, the first contact 170 may contact the first gate structure 120 and the second gate structure 220, and the second contact 370 may contact the third gate structure 320 and the fourth gate structure 420.

However, while the distance L3 of spacing between the fifth gate structure 520 and the sixth gate structure 620 may be greater than the distance L2 of spacing between the third gate structure 320 and the fourth gate structure 420, because the third width W3 of the third contact 570 is substantially equal to the second width W2 of the second contact 370, the third contact 570 does not contact at least one of the fifth gate structure 520 and the sixth gate structure 620.

Figure 26:
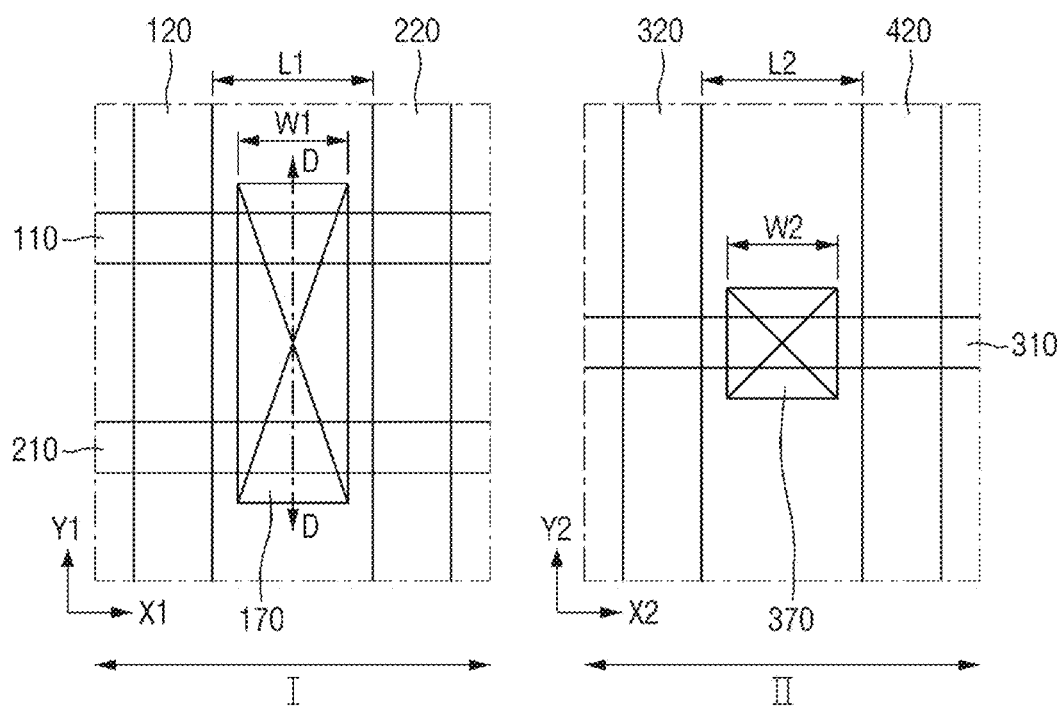
FIG. 26 is a layout diagram provided to explain a semiconductor device according to some example embodiments.
Figure 27:
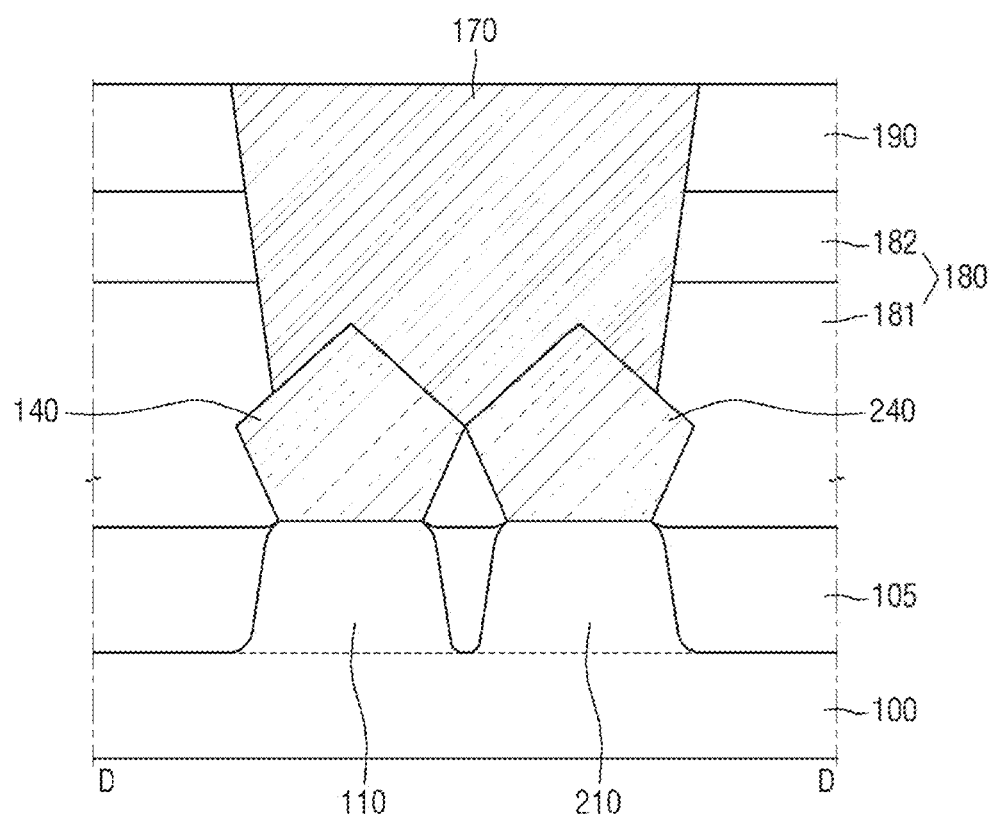
FIG. 27 is a cross sectional view taken on line D-D of FIG. 26.

FIG. 26 is a layout diagram provided to explain a semiconductor device according to some example embodiments. FIG. 27 is a cross sectional view taken on line D-D of FIG. 26.

For convenience of explanation, differences that are not explained above with reference to FIGS. 1 to 5B will be mainly explained below.

Referring to FIGS. 26 and 27, a semiconductor device according to some example embodiments may additionally include a fourth fin-type pattern 210 formed in the first region I.

The fourth fin-type pattern 210 may extend in the first direction X and abreast of the first fin-type pattern 110.

The first gate structure 120 and the second gate structure 220 may each intersect the first fin-type pattern 110 and the fourth fin-type pattern 210.

The first source/drain 140 may be formed on the first fin-type pattern 110. The sixth source/drain 240 may be formed on the fourth fin-type pattern 210.

The first source/drain 140 and the sixth source/drain 240 formed on the first fin-type pattern 110 and the adjacent fourth fin-type pattern 210 may contact each other.

The first contact 170 may be connected with the first source/drain 140 and the sixth source/drain 240 that contact each other.

The first contact 170 may include, for example, a shared contact.

Figure 28:
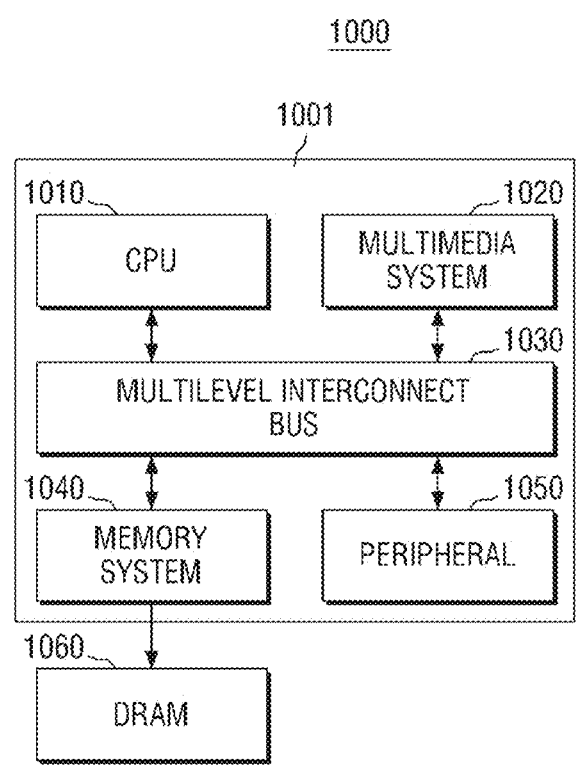
FIG. 28 is a block diagram of a SoC system comprising a semiconductor device according to example embodiments.

FIG. 28 is a block diagram of a SoC system comprising a semiconductor device according to example embodiments.

Referring to FIG. 28, a SoC system 1000 includes an application processor 1001 and a dynamic random-access memory (DRAM) 1060.

The application processor 1001 may include a central processing unit (CPU) 1010, a multimedia system 1020, a bus 1030, a memory system 1040 and a peripheral circuit 1050.

The CPU 1010 may perform arithmetic operation necessary for driving of the SoC system 1000. In some example embodiments, the CPU 1010 may be configured on a multi-core environment which includes a plurality of cores.

The multimedia system 1020 may be used for performing a variety of multimedia functions on the SoC system 1000. Such multimedia system 1020 may include a three-dimensional (3D) engine module, a video codec, a display system, a camera system, a post-processor, and so on.

The bus 1030 may be used for exchanging data communication among the CPU 1010, the multimedia system 1020, the memory system 1040 and the peripheral circuit 1050. In some example embodiments, the bus 1030 may have a multi-layer structure. Specifically, an example of the bus 1030 may be a multi-layer advanced high-performance bus (AHB), or a multi-layer advanced eXtensible interface (AXI), although example embodiments are not limited herein.

The memory system 1040 may provide environments necessary for the application processor 1001 to connect to an external memory (e.g., DRAM 1060) and perform high-speed operation. In some example embodiments, the memory system 1040 may include a separate controller (e.g., DRAM controller) to control an external memory (e.g., DRAM 1060).

The peripheral circuit 1050 may provide environments necessary for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory necessary for the operation of the application processor 1001. In some example embodiments, the DRAM 1060 may be arranged externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the example embodiments explained above.

In concluding the detailed description, those skilled in the art will appreciate that many variations and modifications can be made to the example embodiments without substantially departing from the principles of the inventive concepts. Therefore, the disclosed example embodiments are used in a generic and descriptive sense only and not for purposes of limitation.

What is claimed is:

1. A semiconductor device, comprising:
   a substrate including a first region and a second region;
   a first gate structure and a second gate structure on the substrate of the first region, the first gate structure and the second gate structure being spaced apart from each other in a first direction;
   a first source/drain between the first gate structure and the second gate structure, the first source/drain having a first width in the first direction;
   a third gate structure and a fourth gate structure on the substrate of the second region, the third gate structure and the fourth gate structure being spaced apart from each other in a second direction;
   a second source/drain between the third gate structure and the fourth gate structure, the second source/drain having a second width in the second direction, and the second width being greater than the first width;
   a first interlayer insulating film between sidewalls of the first gate structure and the second gate structure, the first interlayer insulating film including a first lower interlayer insulating film and a first upper interlayer insulating film on an upper surface of the first lower interlayer insulating film, the upper surface of the first lower interlayer insulating film including a first concave surface being concave upward and adjacent to the sidewalls of the first gate structure and the second gate structure;
   a second interlayer insulating film between sidewalls of the third gate structure and the fourth gate structure, the second interlayer insulating film including a second lower interlayer insulating film and a second upper interlayer insulating film on an upper surface of the second lower interlayer insulating film, the upper surface of the second lower interlayer insulating film including a second concave surface being concave upward and adjacent to the sidewalls of the third gate structure and the fourth gate structure;
   a first contact penetrating through the first interlayer insulating film and being connected with the first source/drain, the first contact having a third width in the first direction; and
   a second contact penetrating through the second interlayer insulating film and being connected with the second source/drain, the second contact having a fourth width in the second direction, and the fourth width being greater than the third width,
   wherein a width of the first upper interlayer insulating film in the first direction is greater than a width of the first lower interlayer insulating film in the first direction,
   wherein a width of the second upper interlayer insulating film in the second direction is greater than a width of the second lower interlayer insulating film in the second direction, and
   wherein a thickness of the first upper interlayer insulating film is different from a thickness of the second upper interlayer insulating film.

2. The semiconductor device of claim 1, further comprising a first fin-type pattern and a second fin-type pattern protruding from the substrate,
   wherein the first gate structure and the second gate structure intersecting the first fin-type pattern,
   wherein the third gate structure and the fourth gate structure intersecting the second fin-type pattern.

3. The semiconductor device of claim 1, wherein the first gate structure includes a gate spacer defining a trench, a gate insulating film along a sidewall and a bottom surface of the trench, and a gate electrode on the gate insulating film and filling the trench.

4. The semiconductor device of claim 1, wherein the thickness of the first upper interlayer insulating film is greater than the thickness of the second upper interlayer insulating film.

5. The semiconductor device of claim 4, wherein a thickness of the first lower interlayer insulating film is smaller than a thickness of the second lower interlayer insulating film.

6. The semiconductor device of claim 1, further comprising:
   a first liner extending between the first source/drain and the first lower interlayer insulating film, continuing between the first gate structure and the first lower interlayer insulating film, and continuing between the second gate structure and the first lower interlayer insulating film; and
   a second liner extending between the second source/drain and the second lower interlayer insulating film, continuing between the third gate structure and the second lower interlayer insulating film, and continuing between the fourth gate structure and the second lower interlayer insulating film.

7. The semiconductor device of claim 6, wherein the first liner is not interposed between the first gate structure and the first upper interlayer insulating film, and is not interposed between the second gate structure and the first upper interlayer insulating film, and wherein the second liner is not interposed between the third gate structure and the second upper interlayer insulating film, and is not interposed between the fourth gate structure and the second upper interlayer insulating film.

8. The semiconductor device of claim 1, wherein the first gate structure includes a first gate electrode, and the third gate structure includes a second gate electrode, and
wherein a sign of a slope of a sidewall of the first gate electrode is different from a sign of a slope of a sidewall of the second gate electrode.

9. The semiconductor device of claim 8, wherein the sidewall of the first gate electrode makes an obtuse angle with a bottom surface of the first gate electrode.

10. The semiconductor device of claim 8, wherein the sidewall of the second gate electrode makes an acute angle with a bottom surface of the second gate electrode.

11. A semiconductor device, comprising:
a substrate including a first region and a second region;
a first gate structure and a second gate structure on the substrate of the first region, the first gate structure and the second gate structure being spaced apart by a first distance;
a third gate structure and a fourth gate structure on the substrate of the second region, the third gate structure and the fourth gate structure being spaced apart by a second distance greater than the first distance;
a first interlayer insulating film on sidewalls of the first gate structure and the second gate structure, the first interlayer insulating film including a first lower interlayer insulating film and a first upper interlayer insulating film on an upper surface of the first lower interlayer insulating film;
a second interlayer insulating film on sidewalls of the third gate structure and the fourth gate structure, the second interlayer insulating film including a second lower interlayer insulating film and a second upper interlayer insulating film on an upper surface of the second lower interlayer insulating film;
a first contact penetrating through the first interlayer insulating film between the first gate structure and the second gate structure, the first contact having a first width; and
a second contact penetrating through the second interlayer insulating film between the third gate structure and the fourth gate structure, the second contact having a second width greater than the first width,
wherein a first ratio of a thickness of the first upper interlayer insulating film to a thickness of the first interlayer insulating film is different from a second ratio of a thickness of the second upper interlayer insulating film to a thickness of the second interlayer insulating film.

12. The semiconductor device of claim 11, wherein the first ratio is greater than the second ratio.

13. The semiconductor device of claim 11, wherein the first gate structure includes a first gate electrode, and the third gate structure includes a second gate electrode, and
wherein a sign of a slope of a sidewall of the first gate electrode is different from a sign of a slope of a sidewall of the second gate electrode.

14. The semiconductor device of claim 13, wherein the sidewall of the first gate electrode makes an obtuse angle with a bottom surface of the first gate electrode.

15. The semiconductor device of claim 13, wherein the sidewall of the second gate electrode makes an acute angle with a bottom surface of the second gate electrode.

16. The semiconductor device of claim 11, wherein the upper surface of the first lower interlayer insulating film includes a first concave surface being concave upward and adjacent to the sidewalls of the first gate structure and the second gate structure, and
wherein the upper surface of the second lower interlayer insulating film includes a second concave surface being concave upward and adjacent to the sidewalls of the third gate structure and the fourth gate structure.

17. The semiconductor device of claim 11, further comprising:
a first liner extending between the first gate structure and the first lower interlayer insulating film, and extending between the second gate structure and the first lower interlayer insulating film; and
a second liner extending between the third gate structure and the second lower interlayer insulating film, and extending between the fourth gate structure and the second lower interlayer insulating film.

* * * * *